US006795558B2

(12) United States Patent
Matsuo

(10) Patent No.: US 6,795,558 B2
(45) Date of Patent: Sep. 21, 2004

(54) MICROPHONE ARRAY APPARATUS

(75) Inventor: Naoshi Matsuo, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 543 days.

(21) Appl. No.: 10/038,188

(22) Filed: Oct. 26, 2001

(65) Prior Publication Data

US 2002/0106092 A1 Aug. 8, 2002

Related U.S. Application Data

(62) Division of application No. 09/039,777, filed on Mar. 16, 1998, now Pat. No. 6,317,501.

(30) Foreign Application Priority Data

Jun. 26, 1997 (JP) ............................................ 9-170288

(51) Int. Cl.$^{7}$ ................................................ H03R 3/00

(52) U.S. Cl. .......................... 381/92; 381/122; 381/56; 348/14.09

(58) Field of Search .......................... 381/92, 91, 122, 381/356, 58, 56, 26; 348/23.4, 14.09; 367/124, 129

(56) References Cited

U.S. PATENT DOCUMENTS

| | | | | |
|---|---|---|---|---|
| 4,355,368 A | | 10/1982 | Zeidler et al. | |
| 5,027,393 A | | 6/1991 | Yamamura et al. | |
| 5,471,538 A | | 11/1995 | Sasaki et al. | |
| 5,561,598 A | | 10/1996 | Nowak et al. | |
| 5,737,431 A | * | 4/1998 | Brandstein et al. | 381/92 |
| 5,740,256 A | | 4/1998 | Castello Da Costa et al. | |
| 5,754,665 A | | 5/1998 | Hosoi | |
| 5,778,082 A | * | 7/1998 | Chu et al. | 381/92 |
| 5,796,819 A | | 8/1998 | Romesburg | |
| 5,835,607 A | | 11/1998 | Martin et al. | |
| 6,041,127 A | | 3/2000 | Elko | |
| 6,317,501 B1 | * | 11/2001 | Matsuo | 381/92 |
| 6,469,732 B1 | * | 10/2002 | Chang et al. | 348/14.08 |
| 6,483,532 B1 | * | 11/2002 | Girod | 348/14.12 |
| 6,593,956 B1 | * | 7/2003 | Potts et al. | 348/14.09 |
| 6,600,824 B1 | * | 7/2003 | Matsuo | 381/92 |
| 6,618,485 B1 | * | 9/2003 | Matsuo | 381/92 |
| 6,694,028 B1 | * | 2/2004 | Matsuo | 381/92 |
| 2004/0105555 A1 | * | 6/2004 | Stromme | 381/56 |

FOREIGN PATENT DOCUMENTS

| | | | | |
|---|---|---|---|---|
| JP | 62-120734 | | 6/1987 | |
| JP | 1-24667 | | 1/1989 | |
| JP | 407281672 A | | 10/1995 | |
| JP | 11027099 | | 1/1999 | |
| JP | 11041577 | * | 2/1999 | H04N/7/15 |

* cited by examiner

*Primary Examiner*—Xu Mei
(74) *Attorney, Agent, or Firm*—Katten Muchin Zavis Rosenman

(57) ABSTRACT

A microphone array apparatus includes a microphone array including microphones, one of the microphones being a reference microphone, filters receiving output signals of the microphones, and a filter coefficient calculator which receives the output signals of the microphones, a noise and a residual signal obtained by subtracting filtered output signals of the microphones other than the reference microphone from a filtered output signal of the reference microphone and which obtain filter coefficients of the filters in accordance with an evaluation function based on the residual signal.

1 Claim, 20 Drawing Sheets

MICROPHONE ARRAY APPARATUS

CROSS REFERENCE TO RELATED APPLICATION

This is a Divisional of application Ser. No. 09/039,777 filed on Mar. 16, 1998 now U.S. Pat. No. 6,317,501.

BACKGROUND THE INVENTION

Field of the Invention

The present invention relates to a microphone array apparatus which has an array of microphones in order to detect the position of a sound source, emphasize a target sound and suppress noise.

The microphone array apparatus has an array of a plurality of omnidirectional microphones and equivalently define a directivity by emphasizing a target sound and suppressing noise. Further, the microphone array apparatus is capable of detecting the position of a sound source on the basis of a relationship among the phases of output signals of the microphones. Hence, the microphone array apparatus can be applied to a video conference system in which a video camera is automatically oriented towards a speaker and a speech signal and a video signal can concurrently be transmitted. In addition, the speech of the speaker can be clarified by suppressing ambient noise. The speech of the speaker can be emphasized by adding the phases of speech components. It is now required that the microphone array apparatus can stably operate.

If the microphone array apparatus is directed to suppressing noise, filters are connected to respective microphones and filter coefficients are adaptively or fixedly set so as to minimize noise components (see, for example, Japanese Laid-Open Patent Application No. 5-111090). If the microphone array apparatus is directed to detecting the position of a sound source, the relationship among the phases of the output signals of the microphones is detected, and the distance to the sound source is detected (see, for example, Japanese Laid-Open Patent Application Nos. 63-177087 and 4-236385).

An echo canceller is known as a device which utilizes the noise suppressing technique. For example, as shown in FIG. 1, a transmit/receive interface 202 of a telephone set is connected to a network 203. An echo canceller is connected between a microphone 204 and a speaker 205. A speech of a speaker is input to the microphone 204. A speech of a speaker on the other (remote) side is reproduced through the speaker 205. Hence, a mutual communication can take place.

A speech transferred from the speaker 205 to the microphone 204, as indicated by a dotted line shown in FIG. 1 forms an echo (noise) to the other-side telephone set. Hence, the echo canceller 201 is provided that includes a subtracter 206, an echo component generator 207 and a coefficient calculator 208. Generally, the echo generator 207 has a filter structure which produces an echo component from the signal which drives the speaker 205. The subtracter 206 subtracts the echo component from the signal from the microphone 204. The coefficient calculator 208 controls the echo generator 207 to update the filter coefficients so that the residual signal from the subtracter 206 is minimized.

The updating of the filter coefficients c1, c2, . . . , cr of the echo component generator 207 having the filter structure can be obtained by a known maximum drop method. For example, the following evaluation function J is defined based on an output signal e (the residual signal in which the echo component has been subtracted) of the subtracter 206:

$$J=e^2 \tag{1}$$

According to the above evaluation function, the filter coefficients c1, c2, . . . , cr are updated as follows:

$$\begin{bmatrix} c1 \\ c2 \\ \vdots \\ cr \end{bmatrix} = \begin{bmatrix} c1_{old} \\ c2_{old} \\ \vdots \\ cr_{old} \end{bmatrix} + \alpha*(e/f_{norm})*\begin{bmatrix} f(1) \\ f(2) \\ \vdots \\ f(r) \end{bmatrix} \tag{2}$$

where 0.0<α<0.5

$$f_{norm}=(f(1)^2+f(2)^2+\ldots f(r)^2)^{1/2} \tag{3}$$

In the above expressions, a symbol "*" denotes multiplication, and "r" denotes the filter order. Further, f(1), . . . , f(r) respectively denote the values of a memory (delay unit) of the filter (in other words, the output signals of delay units each of which delays the respective input signal by a sample unit). A symbol "$f_{norm}$" is defined as equation (3), and a symbol "α" is a constant, which represents the speed and precision of convergence of the filter coefficients towards the optimal values.

The echo canceller 201 has filter orders as many as 100. Hence, another echo canceller using a microphone array as shown in FIG. 2 is known. There are provided an echo canceller 211, a transmit/receive interface 212, microphones 214-1–214-n forming a microphone array, a speaker 215, a subtracter 216, filters 217-1–217-n, and a filter coefficient calculator 218.

In the structure shown in FIG. 2, acoustic components from the speaker 215 to the microphones 214-1–214-n are propagated along routes indicated by broken lines and serve as echoes. Hence, the speaker 215 is a noise source. The updating control of the filter coefficients c11, c12, . . . , c1r, . . . , cn1, cn2, . . . , cnr in the case where the speaker does not make any speech is expressed by using the evaluation function (1) as follows:

$$\begin{bmatrix} c11 \\ c12 \\ \vdots \\ c1r \end{bmatrix} = \begin{bmatrix} c11_{old} \\ c12_{old} \\ \vdots \\ c1r_{old} \end{bmatrix} - \alpha*(e/f1_{norm})*\begin{bmatrix} f1(1) \\ f1(2) \\ \vdots \\ f1(r) \end{bmatrix} \tag{4}$$

$$\begin{bmatrix} cp1 \\ cp2 \\ \vdots \\ cpr \end{bmatrix} = \begin{bmatrix} cp1_{old} \\ cp2_{old} \\ \vdots \\ cpr_{old} \end{bmatrix} + \alpha*(e/fp_{norm})*\begin{bmatrix} fp(1) \\ fp(2) \\ \vdots \\ fp(r) \end{bmatrix} \tag{5}$$

where $p = 2, 3, \ldots, n$

The equation (4) relates to a case where one of the microphones 214-1–214-n, for example, the microphone 214-1 is defined as a reference microphone, and indicates the filter coefficients c11, c12, . . . , c1r of the filter 217-1 which receives the output signal of the above reference microphone 214-1. The equation (5) relates to the microphones 214-2–214-n other than the reference microphones, and indicates the filter coefficients c21, c22, . . . , c2r, . . . , cn1, cn2, . . . , cnr. The subtracter 216 subtracts the output signals 217-2–217-n of the microphones 214-2–214-n from the output signal 217-1 of the reference microphone 214-1.

FIG. 3 is a block diagram for explaining a conventional process of detecting the position of a sound source and emphasizing a target sound. The structure shown in FIG. 3 includes a target sound emphasizing unit 221, a sound source detecting unit 222, delay units 223 and 224, a number-of-delayed-samples calculator 225, an adder 226, a crosscorrelation coefficient calculator 227, a position detection processing unit 228 and microphones 229-1 and 229-2.

The target sound emphasizing unit 221 includes the delay units 223 and 224 of $Z^{-da}$ and $Z^{-db}$, the number-of-delayed-samples calculator 225 and the adder 226. The sound source position detecting unit 222 includes the crosscorrelation coefficient calculator 227 and the position detection processing unit 228. The number-of-delayed samples calculator 225 is controlled by the following factors. The crosscorrelation coefficient calculator 227 of the sound source position detecting unit 222 obtains a crosscorrelation coefficient r(i) of output signals a(j) and b(j) of the microphones 229-1 and 229-2. The position detection processing unit 228 obtains the sound source position by referring to a value of i, imax, at which the maximum of the crosscorrelation coefficient r(i) can be obtained.

The crosscorrelation coefficient r(i) is expressed as follows:

$$r(i)=\Sigma^{n}_{j=1}a(j)*b(j+i) \quad (6)$$

where $\Sigma^{n}_{j=1}$ denotes a summation of j=1 to j=n, and i has a relationship $-m \leqq i \leqq m$. The symbol "m" is a value dependent on the distance between the microphones 229-1 and 229-2 and the sampling frequency, and is written as follows:

$$m=[(\text{sampling frequency})*(\text{intermichrophone distance})]/(\text{speed of sound}) \quad (7)$$

where n is the number of samples for a convolutional operation.

The number of delayed samples da of the $Z^{-da}$ delay unit 223 and the number of delayed samples db of the $Z^{-db}$ delay unit 224 can be obtained as follows from the value imax at which the maximum value of the crosscorrelation coefficient r(i) can be obtained:

where $i \geqq 0$, da=i, db=0 where i<0, da=0, db=–i.

Hence, the phases of the target sound from the sound source are made to coincide with each other and are added by the adder 226. Hence, the target sound can be emphasized.

However, the above-mentioned conventional microphone array apparatus has the following disadvantages.

In the conventional structure directed to suppressing noise, when the speaker of the target sound source does not speak, the echo components from the speaker to the microphone array can be canceled by the echo canceller. However, when a speech of the speaker and the reproduced sound from the speaker are concurrently input to the microphone array, the updating of the filter coefficients for canceling the echo components (noise components) does not converge. That is, the residual signal e in the equations (4) and (5) corresponds to the sum of the components which cannot be suppressed by the subtracter 216 and the speech of the speaker. Hence, if the filter coefficients are updated so that the residual signal e is minimized, the speech of the speaker which is the target sound is suppressed along with the echo components (noise). Hence, the target noise cannot be suppressed.

In the conventional structure directed to detecting the sound source position and emphasizing the target sound, the output signals a(j) and b(j) of the microphones 229-1 and 229-2 shown in FIG. 3 generally have an autocorrelation in the vicinity of the sampled values. If the sound source is white noise or pulse noise, the autocorrelation is reduced, while the autocorrelation for vice is increased. The crosscorrelation function r(i) defined in the equation (6) has a less variation as a function of i with respect to a signal having comparatively large autocorrelation than a variation with respect to a signal having comparatively small autocorrelation. Hence, it is very difficult to obtain the correct maximum value and precisely and rapidly detect the position of the sound source.

In the conventional structure directed to emphasizing the target sound so that the phases of the target sounds are synchronized, the degree of emphasis depends on the number of microphones forming the microphone array. If there is a small crosscorrelation between the target sound and noise, the use of N microphones emphasizes the target sound so that the power ratio is as large as N times. If there is a large correction between the target sound and noise, the power ratio is small. Hence, in order to emphasize the target sound which has a large crosscorrelation to the noise, it is required to use a large number of microphones. This leads to an increase in the size of the microphone array. It is very difficult to identify, under noisy environment, the position of the power source by utilizing the crosscorrelation coefficient value of the equation (6).

SUMMARY OF THE INVENTION

It is a general object of the present invention to provide a microphone array apparatus in which the above disadvantages are eliminated.

A more specific object of the present invention is to provide a microphone array apparatus capable of stably and precisely suppressing noise, emphasizing a target sound and identifying the position of a sound source.

The above objects of the present invention are achieved by a microphone array apparatus comprising: a microphone array including microphones (which correspond to parts indicated by reference numbers 1-1–1-n in the following description), one of the microphones being a reference microphone (1-1); filters (2-1–2-n) receiving output signals of the microphones; and a filter coefficient calculator (4) which receives the output signals of the microphones, a noise and a residual signal obtained by subtracting filtered output signals of the microphones other than the reference microphone from a filtered output signal of the reference microphone and which obtain filter coefficients of the filters in accordance with an evaluation function based on the residual signal. With this structure, even when speech of a speaker corresponding to the sound source and the noise are concurrently applied to the microphones, the crosscorrelation function value is reduced so that the noise can be effectively suppressed and the filter coefficients can continuously be updated.

The above microphone array apparatus may be configured so that it further comprises: delay units (8-1–8-n) provided in front of the filters; and a delay calculator (9) which calculates amounts of delays of the delay units on the basis of a maximum value of a crosscorrelation function of the output signals of the microphones and the noise. Hence, the filter coefficients can easily be updated.

The microphone array apparatus may be configured so that the noise is a signal which drives a speaker. This structure is suitable for a system that has a speaker in addition to the microphones. A reproduced sound from the speaker may serve as noise. By handling the speaker as a noise source, the signal driving the speaker can be handled as the noise, and thus the filter coefficients can easily be updated.

The microphone array apparatus may further comprise a supplementary microphone (21) which outputs the noise. This structure is suitable for a system which has microphones but does not have a speaker. The output signal of the supplementary microphone can be used as the noise.

The microphone array apparatus may be configured so that the filter coefficient calculator includes a cyclic type low-pass filter (FIG. 10) which applies a comparatively small weight to memory values of a filter portion which executes a convolutional operation in an updating process of the filter coefficients.

The above objects of the present invention are also achieved by a microphone array apparatus comprising: a microphone array including microphones (51-1, 51-2); linear predictive filters (52-1, 52-2) receiving output signals of the microphones; linear predictive analysis units (53-1, 53-2) which receives the output signals of the microphones and update filter coefficients of the linear predictive filters in accordance with a linear predictive analysis; and a sound source position detector (54) which obtains a crosscorrelation coefficient value based on linear predictive residuals of the linear predictive filters and outputs information concerning the position of a sound source based on a value which maximizes the crosscorrelation coefficient. Hence, even when speech of a speaker corresponding to the sound source and the noise are concurrently applied to the microphones, autocorrelation function values of samples about the speech signal are reduced to the linear predictive analysis, so that the position of the target source can accurately be detected. Thus, speech from the target sound can be emphasized and noise components other than the target sound can be suppressed.

The microphone array apparatus may be configured so that: a target sound source is a speaker; and the linear predictive analysis unit updates the filter coefficients of the linear predictive filters by using a signal which drives the speaker. Hence, the linear predictive analysis unit can be commonly used to the linear predictive filters corresponding to the microphones.

The above-mentioned objects of the present invention are achieved by a microphone array apparatus comprising: a microphone array including microphones (61-1, 61-2); a signal estimator (62) which estimates positions of estimated microphones in accordance with intervals at which the microphones are arranged by using the output signals of the microphones and a velocity of sound and which outputs output signals of the estimated microphones together with the output signals of the microphones forming the microphone array; and a synchronous adder (63) which pulls phases of the output signals of the microphones and the estimated microphones and then adds the output signals. Hence, even if a small number of microphones is used to form an array, the target sound can be emphasized and the position of the target sound source can precisely be detected as if a large number of microphones is used.

The microphone array apparatus may further comprise a reference microphone (71) located on an imaginary line connecting the microphones forming the microphone array and arranged at intervals at which the microphones forming the microphone array are arranged, wherein the signal estimator which corrects the estimated positions of the estimated microphones and the output signals thereof on the basis of the output signals of the microphones forming the microphone array.

The microphone array apparatus may further comprise an estimation coefficient decision unit (74) weights an error signal which corresponds to a difference between the output signal of the reference microphone and the output signals of the signal estimator in accordance with an acoustic sense characteristic so that the signal estimator performs a signal estimating operation on a band having a comparatively high acoustic sense with a comparatively high precision.

The microphone array apparatus may be configured so that: given angles are defined which indicate directions of a sound source with respect to the microphones forming the microphone array; the signal estimator includes parts which are respectively provided to the given angles; the synchronous adder includes parts which are respectively provided to the. given angles; and the microphone array apparatus further comprises a sound source position detector which outputs information concerning the position of a sound source based on a maximum value among the output signals of the parts of the synchronous adder.

The above objects of the present invention are also achieved by a microphone array apparatus comprising: a microphone array including microphones (91-1, 91-2); a sound source position detector (92) which detects a position of a sound source on the basis of output signals of the microphones; a camera (90) generating an image of the sound source; a second detector (93) which detects the position of the sound source on the basis of the image from the camera; and a joint decision processing unit (94) which outputs information indicating the position of the sound source on the basis of the information from the sound source position detector and the information from the second detector. Hence, the position of the target sound source can by rapidly and precisely detected.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Figure 1:
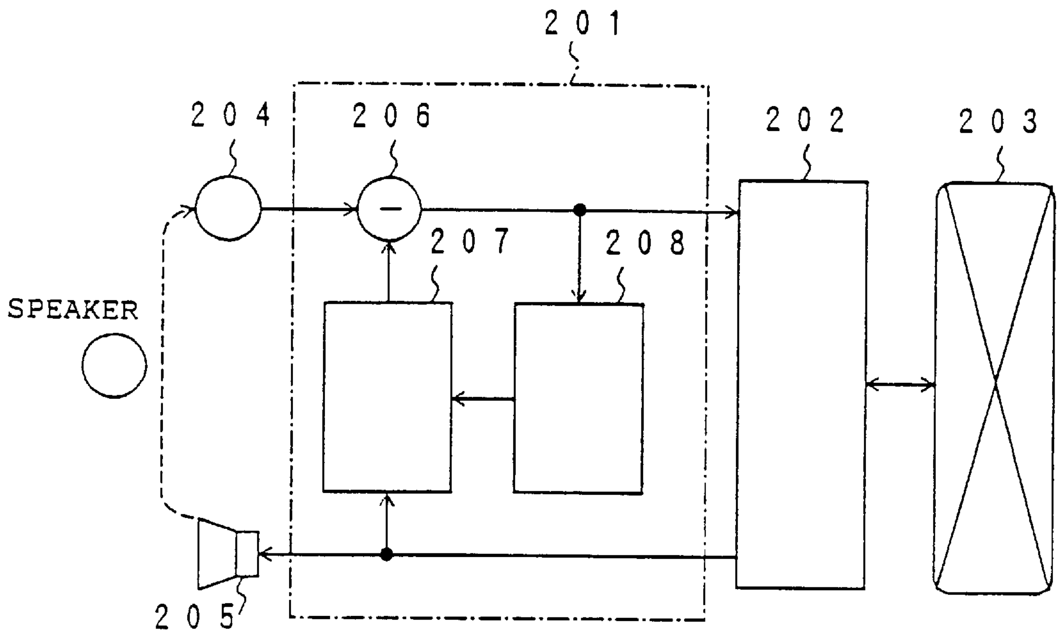
FIG. 1 PRIOR ART
FIG. 1 is a block diagram of a conventional echo canceller.
Figure 2:
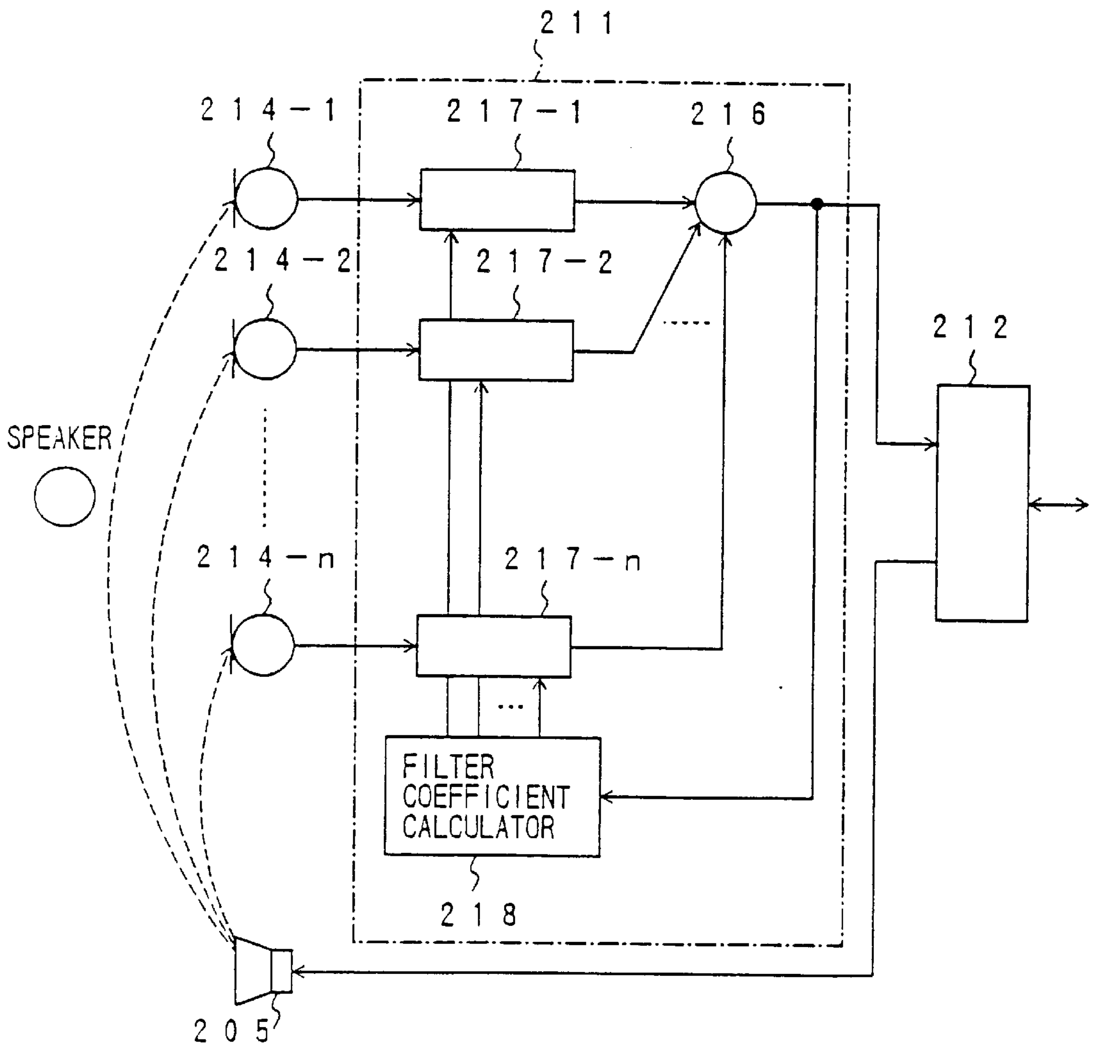
FIG. 2 PRIOR ART
FIG. 2 is a diagram of a conventional echo canceller using a microphone array.
Figure 3:
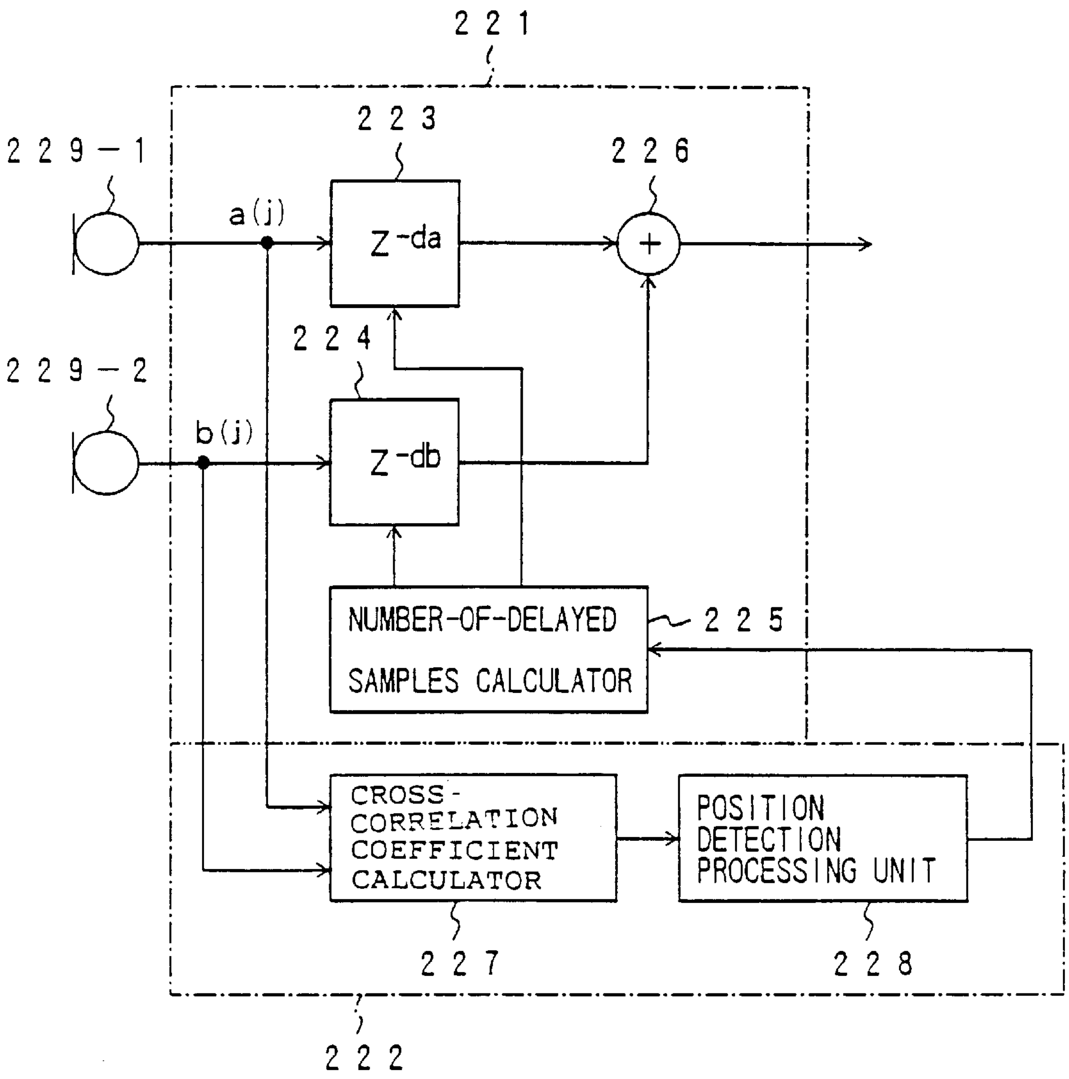
FIG. 3 PRIOR ART
FIG. 3 is a block diagram of a structure directed to detecting the position of a sound source and emphasizing the target sound.
Figure 4:
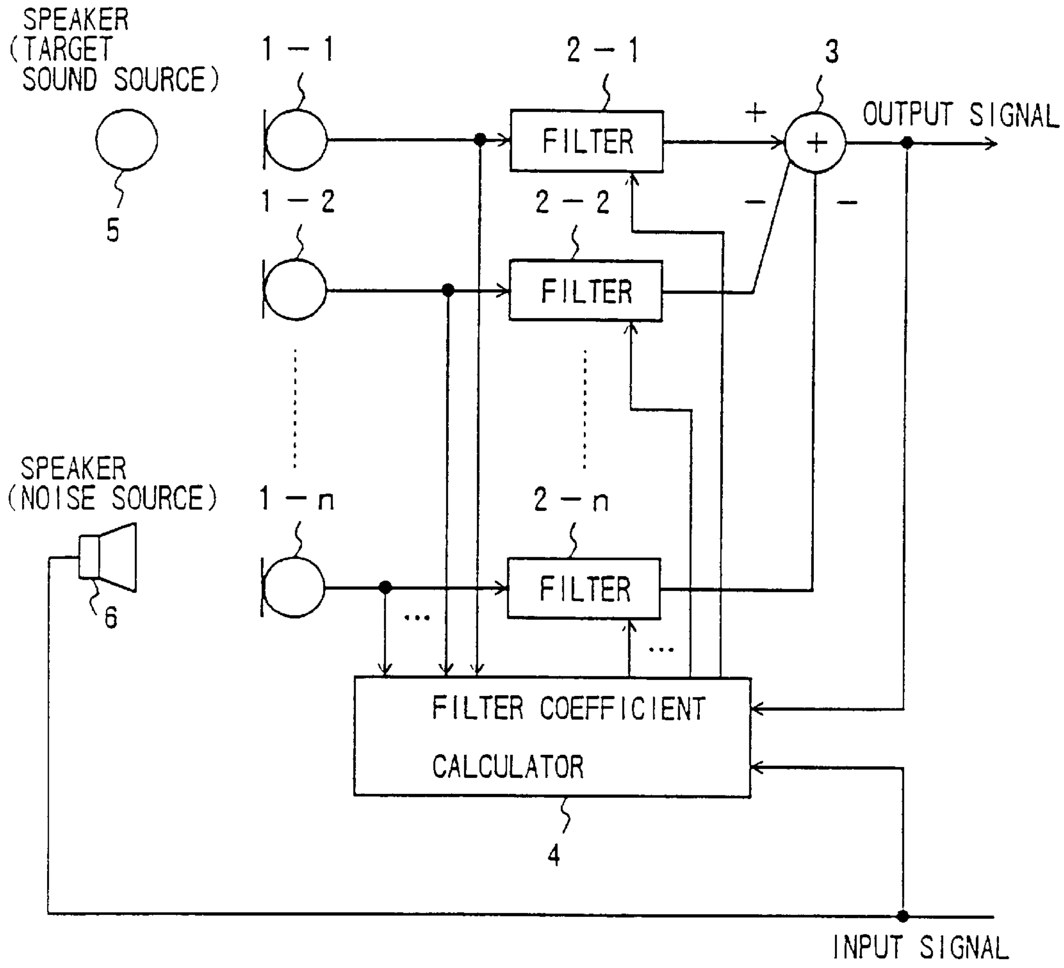
FIG. 4 is a block diagram of a first embodiment of the present invention.

A description will now be given, with reference to FIG. 4, of a microphone array apparatus according to a first embodiment of the present invention. The apparatus shown in FIG. 4 is made up of n microphones 1-1–1-n forming a microphone array, filters 2-1–2-n, an adder 3, a filter coefficient calculator 4, a speaker (target sound source) 5, and a speaker (noise source). The speech of the speaker 5 is input to the microphones 1-1–1-n, which converts the received acoustic signals into electric signals, which pass through the filters 2-1–2-n and are then applied to the adder 3. The output signal of the adder 3 is then to a remote terminal via a network or the like. A speech signal from the remote side is applied to the speaker 6, which is thus driven to reproduce the original speech. Hence, the speaker 5 communicates with the other-side speaker. The reproduced speech is input to the microphones 1-1–1-n, and thus functions as noise to the speech of the speaker 5. Hence, the speaker 6 is a noise source with respect to the target sound source.

The filter coefficient calculator 4 is supplied with the output signals of the microphones 1-1–1-n, a noise (an input signal for driving the speaker serving as noise source), and the output signal (residual signal) of the adder 3, and thus updates the coefficients of the filters 2-1–2-n. In this case, the microphone 1-1 is handled as a reference microphone. The subtracter 3 subtracts the output signals of the filters 2-2–2-n from the output signal of the filter 2-1.

Figure 5:
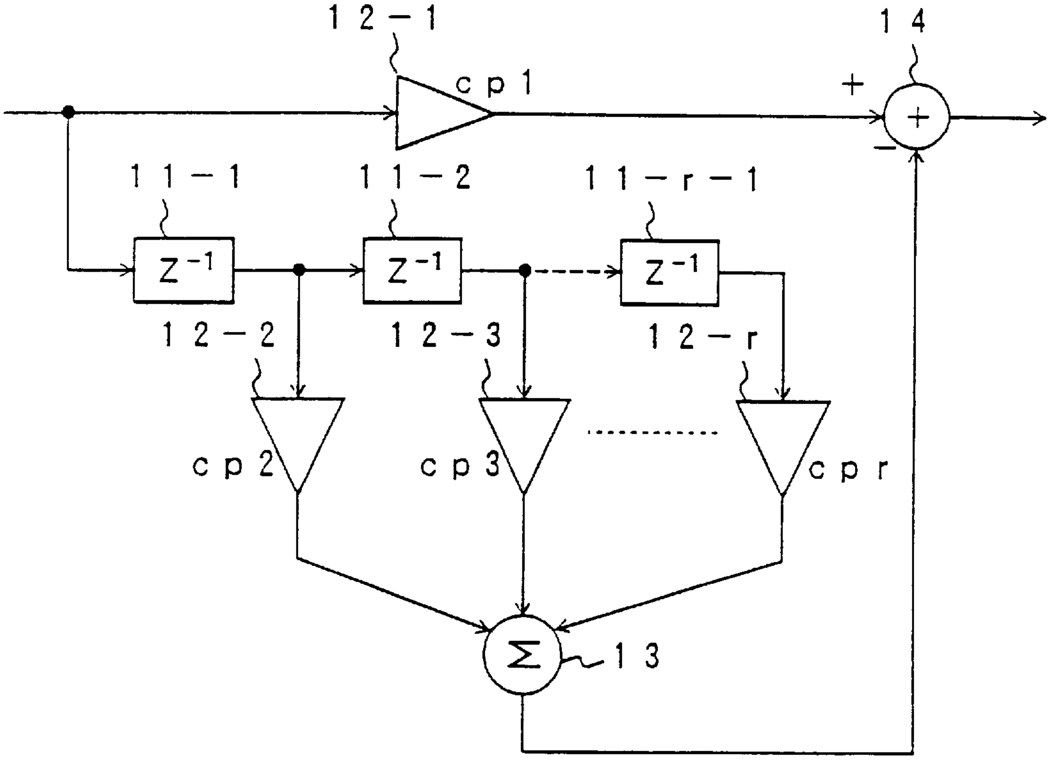
FIG. 5 is a block diagram of a filter which can be used in the first embodiment of the present invention.

Each of the filters 2-1–2-n can be configured as shown in FIG. 5. Each filter includes $Z^{-1}$ delay units 11-1–11-r–1, coefficient units 12-1–12-r for multiplication of filter coefficients cp1, cp2, . . . , cpr, and adders 13 and 14. A symbol “r” denotes the order of the filter.

When the signal from the noise source (speaker 6) is denoted as xp(i) and the signal from the target sound source (speaker 5) is denoted as yp(i) (where i denotes the sample number and p is equal to 1, 2, . . . , n), the values fp(i) of the memories of the filters 2-1–2-n (the input signals to the filters and the output signals of the delay units 11-1–11-r–1) are defined as follows:

$$fp(i)=xp(i)+yp(i) \tag{8}$$

The output signal e of the adder in the echo canceller using the conventional microphone array is as follows:

$$e = [fl(1) \dots fl(r)]\begin{bmatrix} cl1 \\ cl2 \\ \vdots \\ clr \end{bmatrix} - \sum_{i=2}^{n} [fi(1) \dots fi(r)]\begin{bmatrix} ci1 \\ ci2 \\ \vdots \\ cir \end{bmatrix} \tag{9}$$

where f1(1), f1(2), . . . , f1(r), . . . , fi(1), fi(2), . . . , fi(r) denote the values of the memories of the filters. The adder subtracts the output signals of the filters other than the reference filter from the output signal of the reference filter.

In contrast, the present invention controls the signals xp(i) in phase and performs the convolutional operation. The output signal e' of the adder thus obtained is as follows:

$$e' = [fl(1)' \dots fl(r)']\begin{bmatrix} cl1 \\ cl2 \\ \vdots \\ clr \end{bmatrix} - \sum_{i=2}^{n} [fi(1)' \dots fi(r)']\begin{bmatrix} ci1 \\ ci2 \\ \vdots \\ cir \end{bmatrix} \tag{10}$$

$$[fp(1)' \dots fp(r)'] = [x(1)p \dots x(q)(p)]\begin{bmatrix} fp(1) & \cdots & fp(r) \\ fp(2) & \cdots & fp(r+1) \\ \vdots & & \\ fp(q) & \cdots & fp(q+r-1) \end{bmatrix} \tag{11}$$

where (p) in x(1)(p), . . . , x(q)(p) denotes signals from the noise source obtained when the microphones 1-1–1-n are in phase, and the symbol “q” denotes the number of samples on which the convolutional operation is executed.

When the signals xp(i) from the noise source and the signals yp(i) of the target sound source are concurrently input, that is, when the speaker 5 speaks at the same time as the speaker 6 outputs a reproduced speech, there is a small crosscorrelation therebetween because the coexisting speeches are uttered by different speakers. Hence, the equation (11) can be rewritten as follows:

$$\begin{aligned} [fp(1)' \dots fp(r)'] &= [x(1)p \dots x(q)(p)]\begin{bmatrix} fp(1) & \cdots & fp(r) \\ fp(2) & \cdots & fp(r+1) \\ \vdots & & \\ fp(q) & \cdots & fp(q+r-1) \end{bmatrix} \\ &= [x(1)(p) \dots x(q)(p)]\begin{bmatrix} \{xp(1)+yp(1)\} & \cdots & \{xp(r)+yp(r)\} \\ \{xp(2)+yp(2) & \cdots & \{xp(r+1)+yp(r+1)\} \\ \vdots & & \\ \{xp(q)+yp(q)\} & \cdots & \{xp(q+r-1)+yp(q+r-1)\} \end{bmatrix} \end{aligned} \tag{12}$$

-continued $$\approx\left[\sum_{i=1}^{q}x(i)(p)*xp(i)\ \ldots\sum_{i=1}^{q}x(i)(q)*xp(r+i-1)\right]$$

It can be seen from the above equation (12), an influence of the signals yp(i) from the target sound source to [fp(1)', . . . , fp(r)'] is reduced. The signal e' in the equation (10) is obtained by using the equation (12), and then, an evaluation function $J=(e')^2$ is calculated based on the obtained signal e'. Then, based on the evaluation function $J=(e')^2$, the filter coefficients of the filters 2-1–2-n are updated. That is, even in the state in which speeches from the speaker (target sound source) 5 and the speaker (noise source) 6 are concurrently applied to the microphones 1-1–1-n, the noise contained in the output signals of the microphones 1-1–1-n has a large crosscorrelation to the input signal applied to the filter coefficient calculator 4 and used to drive the speaker 6, while having a small crosscorrelation to the target sound source 5. Hence, the filter coefficients can be updated in accordance with the evaluation function $J=(e')^2$. Hence, the output signal of the adder 3 is the speech signal of the speaker 5 in which the noise is suppressed.

Figure 6:
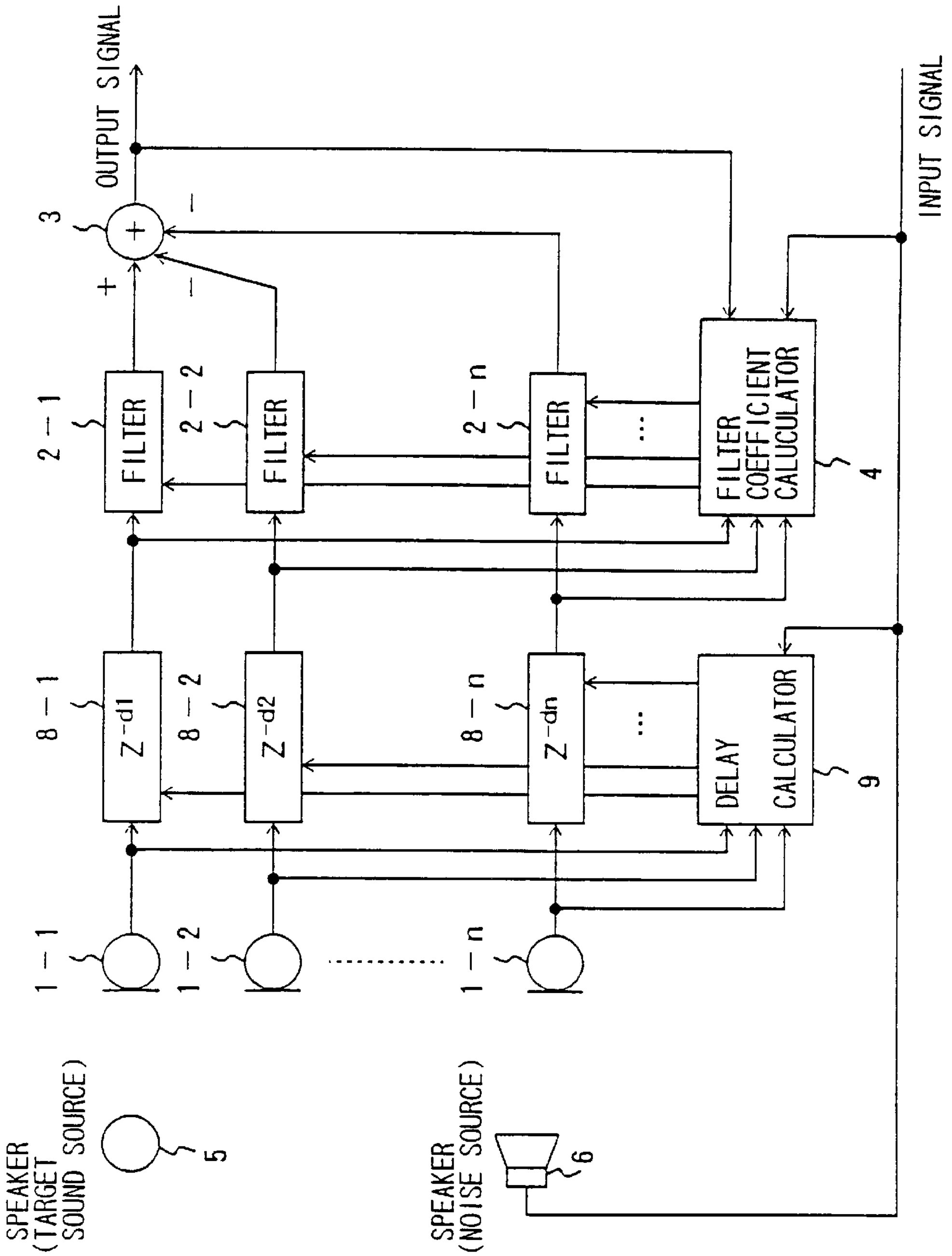
FIG. 6 is a block diagram of a second embodiment of the present invention.

FIG. 6 is a block diagram of a microphone array apparatus according to a second embodiment of the present invention in which parts that are the same as those shown in the previously described figures are given the same reference numbers. The structure shown in FIG. 6 includes delay units 8-1–8-n ($Z^{-d1}$–$Z^{-dn}$), and a delay calculator 9.

The updating of the filter coefficients according to the second embodiment of the present invention is based on the following. The delay calculator 9 calculates the number of delayed samples in each of the delay units 81-1–8-n so that the output signals of the microphones 1-1–1-n are pulled in phase. Further, the filter coefficient calculator 4 calculates the filter coefficients of the filters 2-1–2-n. The delay calculator 9 is supplied with the output signals of the microphones 1-1–1-n, and the input signal (noise) for driving the speaker 6. The filter coefficient calculator 4 is supplied with the output signals of the delay units 8-1–8-n, the output signal of the adder 3 and the input signal (noise) for driving the speaker 6.

When the output signals of the microphones 1-1–1-n are denoted as gp(i) where p=1, 2, . . . , n; j is the sample number, a crosscorrelation function Rp(i) to the signals x(j) from the noise source is as follows:

$$Rp(i)=\Sigma^{s}_{j=1}gp(j+i)*x(j) \qquad (13)$$

where $\Sigma^{s}_{j=1}$ denotes a summation from j=1 to j=s, and s denotes the number of samples on which the convolutional operation is executed. The number s of samples may be equal to tens to hundreds of samples. When a symbol "D" denotes the maximum delayed sample corresponding to the distances between the noise source and the microphones, the term "i" in the equation (13) is such that i=0, 1, 2, . . . , D.

For example, when the maximum distance between the noise source and the furthest microphone is equal to 50 cm, and the sampling frequency is equal to 8 kHz, the speed of sound is approximately equal to 340 m/s, and thus the maximum number D of delayed samples is as follows:

$$D=(\text{sampling frequency})*(\text{maximum distance between the noise souce and microphone})/(\text{speed of sound})=8000*(50/34000)=11.76\approx 12.$$

Hence, the symbol "i" is equal to 1, 2, . . . , 12. When the maximum distance between the noise source and the microphone is equal to 1 m, the maximum number D of delayed samples is equal to 24.

The value ip (p=1, 2, . . . , n) is obtained which is the value of i obtained when the absolute value of the crosscorrelation function value Rp(i) obtained by equation (13). Further, the maximum value imax of the ip is obtained. The above process is comprised of steps (A1)–(A11) shown in FIG. 7. The term imax is set to an initial value (equal to, for example, 0) and the variable p is set equal to 1, at step A1. At step A2, the term Rpmax is set to an initial value (equal to, for example, 0.0), and the term ip is set to an initial value (equal to, for example, 0). Further, at step A2, the variable i is set equal to 0. At step A3, the crosscorrelation function value Rp(i) defined by the equation (13) is obtained.

At step A4, it is determined whether the crosscorrelation function value Rp(i) is greater than the term Rpmax. If the answer is YES, the Rp(i) obtained at that time is set to Rpmax at step A5. If the answer is NO, the variable i is incremented by 1 (i=i+1) at step A6. At step A7, it is determined whether i≦D. If the value i is equal to or smaller than the maximum number D of delayed samples, the process returns to step A3. If the value i exceeds the maximum number D of delayed samples, the process proceeds with step A8. At step A8, it is determined that the value ip is greater than the value imax. If the answer is YES, the value ip obtained at that time is set to imax at step A9. If the answer is NO, the variable p is incremented by 1 (p=p+1) at step A10. At step A11 it is determined whether p≦n. If the answer of step A11 is YES, the process returns to step A2. If the answer is NO, the retrieval of the crosscorrelation function value Rp(i) ends, so that the maximum value imax of the IP within the range of i≦D.

The number dp of delayed samples of the delay unit can be obtained as follows by using the terms ip and imax obtained by the above maximum value detection:

$$dp=imax-ip \qquad (14)$$

Hence, the numbers di–dn of delayed samples of the delay units 8-1–8-n can be set by the delay calculator 9.

The filters 2-1–2-n can be configured as shown in FIG. 5. When the output signals of the filters 2-1–2-n are denoted as outp (p=1, 2, . . . , n) defined by the following:

$$\text{out}p=\Sigma^{n}_{i=1}cpi*fp(i) \qquad (15)$$

where $\Sigma^n_{i=1}$ denotes a summation from i=1 to i=n, cpi denotes the filter coefficients, and fp(i) denotes the values of the memories of the filters and are also input signals applied to the filters.

The filter coefficient calculator 4 calculates the crosscorrelation between the present and past input signals of the filters 2-1–2-n and the signals form the noise source, and thus updates the filler coefficients. The crosscorrelation function value fp(i)' is written as follows:

$$fp(i)'=\Sigma^q_{n=1}x(j)*fp(i+j-1) \tag{16}$$

where $\Sigma^q_{n=1}$ denotes a summation from j=1 to J=q, and the symbol q denotes the number of samples on which the convolutional operation is carried out in order to calculate the crosscorrelation function value and is normally equal to tens to hundreds of samples.

By using the above crosscorrelation function value fp(i)', the output signal e' of the adder 3 is obtained as follows:

$$e' = \sum_{j=1}^{r}[f1(j)'*c1j] - \sum_{j=1}^{n}(fi(j)'*cij] \tag{17}$$

The above operation is the convolutional operation and can be thus implemented by a digital signal processor (DSP). In this case, the adder 3 subtracts the output signals of the microphones 1-2–1-n obtained via the filters 2-2–2-n from the output signal of the reference microphone 1-1 obtained via the filter 2-1.

The evaluation function is defined so that $J=(e')^2$ where the output signal e' of the adder 3 is handled as an error signal. By using the evaluation function $J=(e')^2$, the filter coefficients are obtained. For example, the filter coefficients can be obtained by the steepest descent method. By using the following expressions, the filter coefficients c11, c12, . . . , cn1, cn2, . . . , cnr can be obtained as follows:

$$\begin{bmatrix} c1l \\ c12 \\ \vdots \\ c1r \end{bmatrix} = \begin{bmatrix} c11_{old} \\ c12_{old} \\ \vdots \\ c1r_{old} \end{bmatrix} - t1 * \begin{bmatrix} f1(1)' \\ f1(2)' \\ \vdots \\ f1(r)' \end{bmatrix} \tag{18}$$

$$t1 = \alpha*(e'/f1_{norm})$$

$$\begin{bmatrix} cp1 \\ cp2 \\ \vdots \\ cpr \end{bmatrix} = \begin{bmatrix} cp1_{old} \\ cp2_{old} \\ \vdots \\ cpr_{old} \end{bmatrix} + tp * \begin{bmatrix} fp(1)' \\ fp(2)' \\ \vdots \\ fp(r)' \end{bmatrix} \tag{19}$$

$$tp = \alpha*(e'/fp_{norm})$$
$$p = 2, 3, \ldots n$$

where the norm $fp_{norm}$ corresponds to the aforementioned formula (3) and can be written as follows:

$$fp_{norm}=[(fp(1)')^2+(fp(2)')^2+\ldots+(fp(r)')^2]^{1/2} \tag{20}$$

The term α in the equations (18) and (19) is a constant as has been described previously, and represents the speed and precision of convergence of the filter coefficients towards the optimal values.

Hence, the output signal e' of the adder 3 is obtained as follows:

$$e'=\text{out}1-\Sigma^n_{i=2}\text{out}i \tag{21}$$

The delay units 8-1–8-n change the phases of the input signals applied to the filters 2-1–2-n. Hence, the filter coefficients can easily be updated by the filter coefficient calculator 4. Even under a situation such that the speaker 5 speaks at the same time as a sound is emitted from the speaker 6, the updating of the filter coefficients can be realized. Hence, it is possible to definitely suppress the noise components that enter the microphones 1-1–1-n from the speaker 6 which serves as a noise source.

Figure 8:
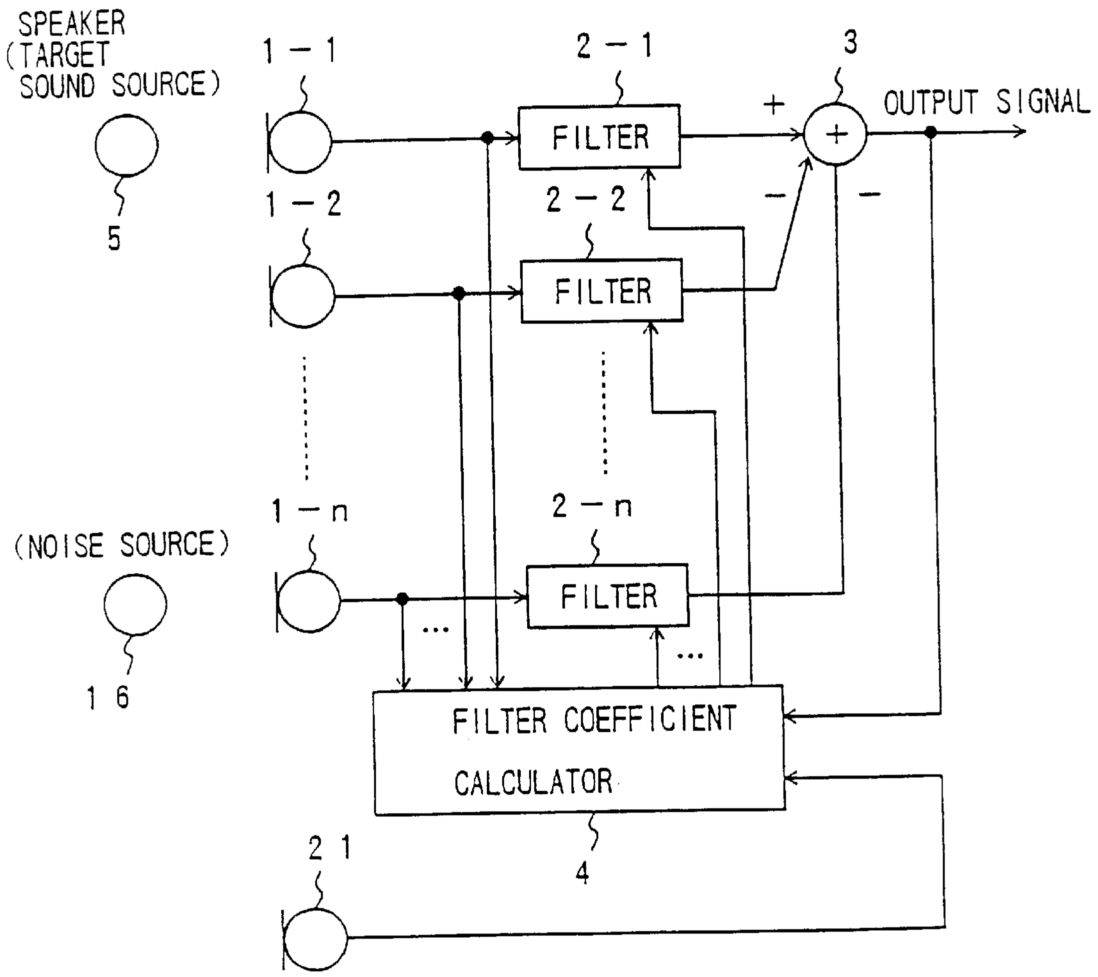
FIG. 8 is a block diagram of a third embodiment of the present invention.

FIG. 8 is a block diagram of a third embodiment of the present invention, in which parts that are the same as those shown in FIG. 4 are given the same reference numbers. In FIG. 8, there are a noise source 16 and a supplementary microphone 21. The supplementary microphone 21 can have the same structure as that of the microphones 1-1–1-n forming the microphone array.

The structure shown in FIG. 8 differs from that shown in FIG. 4 in that the output signal of the supplementary microphone 21 can be input to the filter coefficient calculator 4 as a signal from the noise source. Hence, even in a case where the noise source 16 is an arbitrary noise source other than the speaker, such as an air conditioning system, the noise can be suppressed by using the evaluation function $J=(e')^2$ used to update the filter coefficients, as has been described with reference to FIG. 4.

Figure 7:
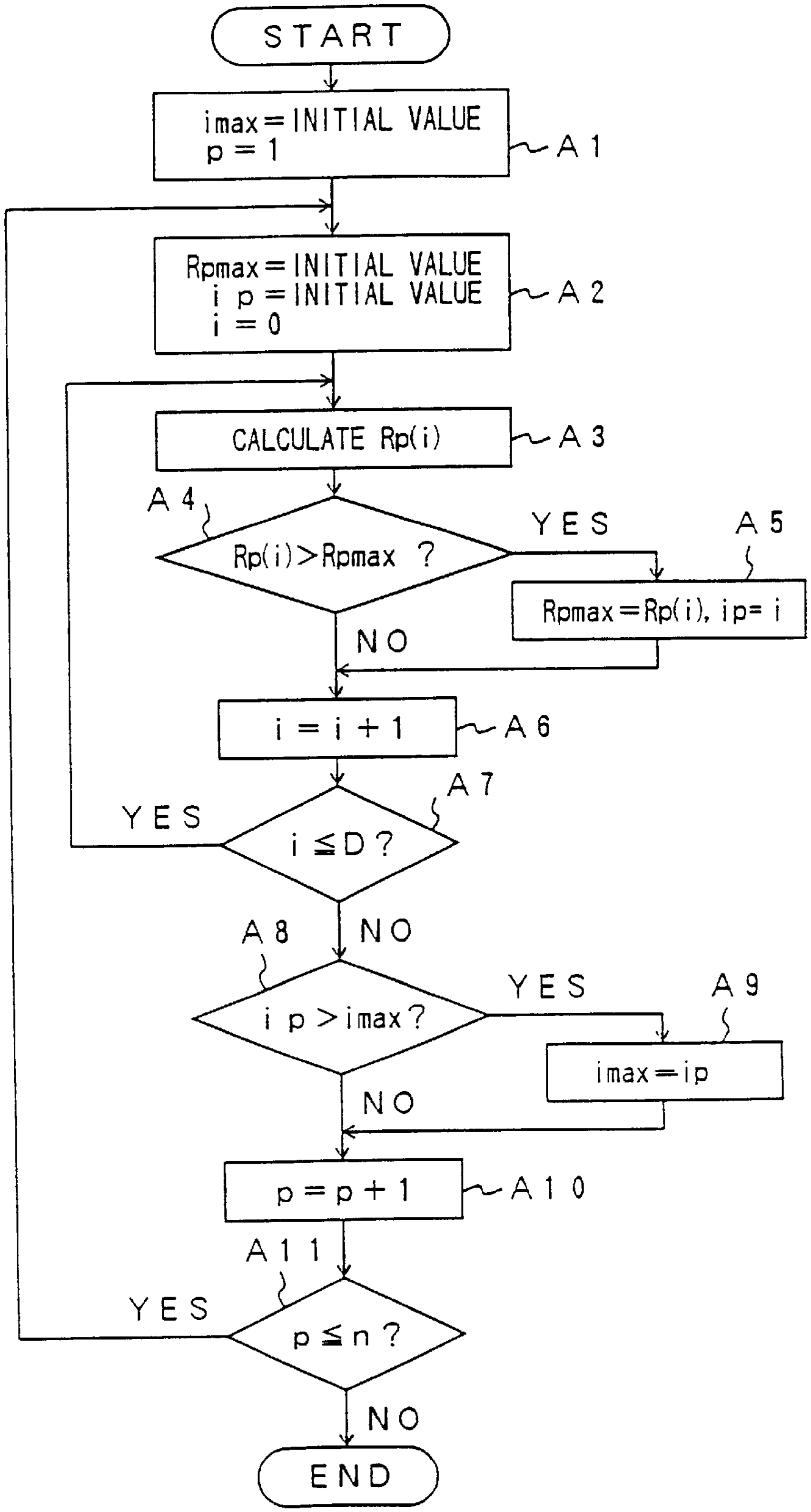
FIG. 7 is a flowchart of an operation of a delay calculator used in the second embodiment of the present invention.
Figure 9:
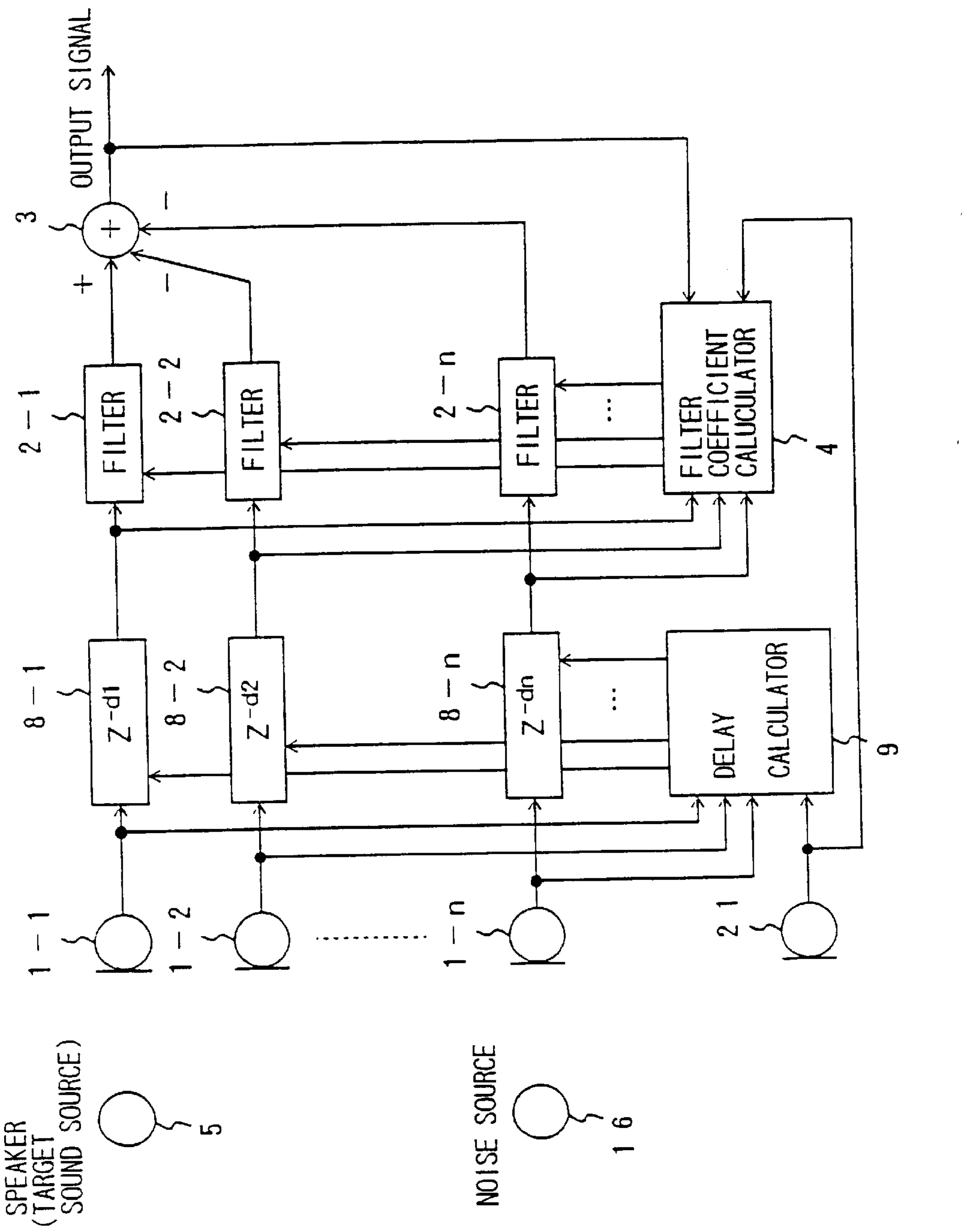
FIG. 9 is a block diagram of a fourth embodiment of the present invention.

FIG. 9 is a block diagram of a fourth embodiment of the present invention, in which parts that are the same as those shown in FIGS. 6 and 7 are given the same reference numbers. The structure shown in FIG. 9 is almost the same as that shown in FIG. 6 except that the output signal of the supplementary microphone 21 is applied, as the signal from a noise source, to the delay calculator 9 and the filter coefficient calculator 4. Hence, as in the case of the structure shown in FIG. 6, the numbers of delayed samples of the delay units 2-1–2-n are controlled by the delay calculator 9, and the filter coefficients of the filters 2-1–2-n are updated by the filter coefficient calculator 4. Hence, noise can be compressed.

Figure 10:
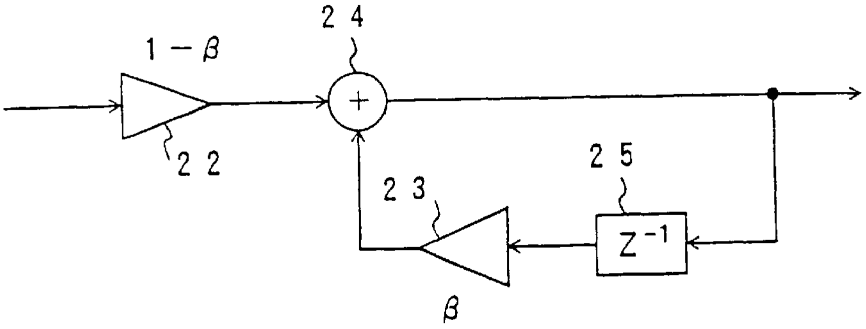
FIG. 10 is a block diagram of a low-pass filter used in a filter coefficient updating process executed in the embodiments of the present invention.

FIG. 10 is a block diagram of a low-pass filter used in the filter coefficient updating process used in the embodiments of the present invention. The low-pass filter shown in FIG. 10 includes coefficient units 22 and 23, an adder 24 and a delay unit 25. The structure shown in FIG. 10 is directed to calculating the aforementioned crosscorrelation function value fp(i)' in which the coefficient unit 23 has a filter coefficient β and the coefficient unit 22 has a filter coefficient (1−β). The value fp(i)' is obtained as follows:

$$fp(i)'=\beta*fp(i)'_{old}+(1-\beta)*[x(1)*fp(i)] \tag{22}$$

where the coefficient β is set so as to satisfy $0.0<\beta<1.0$ and $fp(i)'_{old}$ denotes the value of a memory (delay unit 25) of the low-pass filter.

The low-pass filter shown in FIG. 10 is a cyclic type low-pass filter, in which weighting for the past signals is made comparatively light in order to prevent the convolutional operation from outputting an excessive output value and thus stably obtain the crosscorrelation function value fp(i)'.

Figure 11:
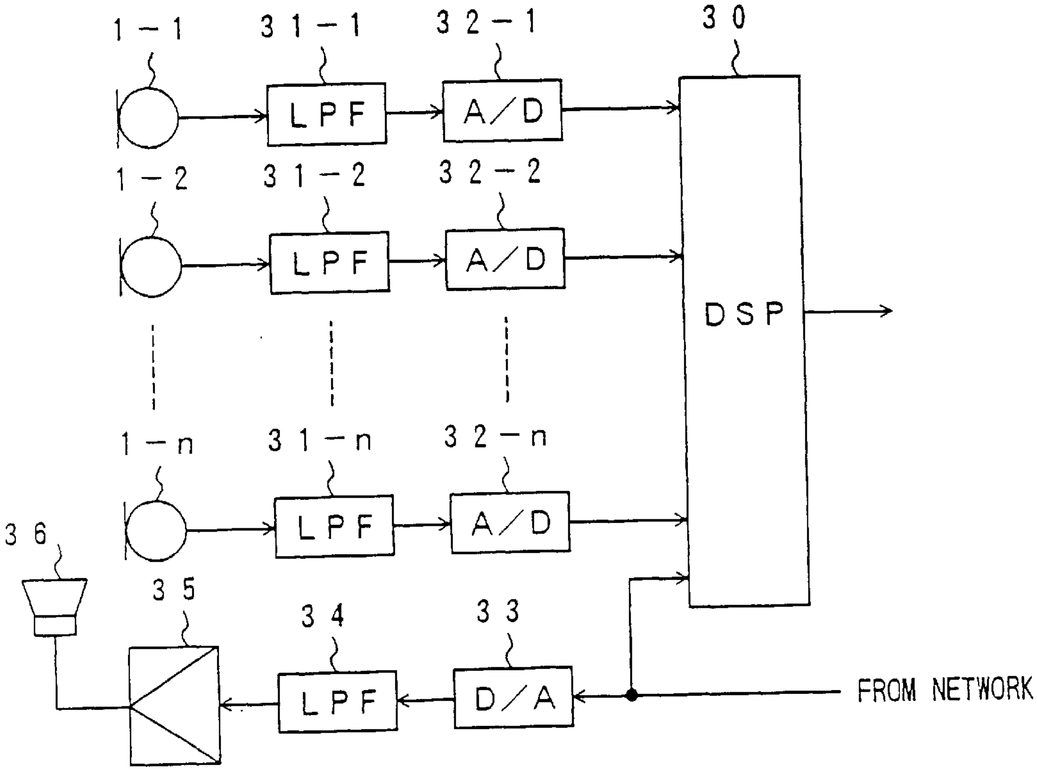
FIG. 11 is a block diagram of a structure using a digital signal processor (DSP)

FIG. 11 is a block diagram of a structure directed to implementing the embodiments of the present invention by using a digital signal processor (DSP). Referring to FIG. 11, there are provided the microphones 1-1–1-n forming a microphone array, a DSP 30, low-pass filters (LPF) 31-1–31-n, analog-to-digital (A/D) converters 32-1–32-n, a digital-to-analog (D/A) converter 33, a low-pass filter (LPF) 34, an amplifier 35 and a speaker 36.

The aforementioned filters 2-1–2-n and the filter coefficient calculator 4 used in the structure shown in FIG. 4 and the filters 2-1–2-n, the filter coefficient calculator 4 and the delay units 8-1–8-n used in the structure shown in FIG. 6 can be realized by the combinations of a repetitive process, a sum-of-product operation and a condition branching process. Hence, the above processes can be implemented by operating functions of the DSP 30.

The low-pass filters 31-1–31-n function to eliminate signal components located outside the speech band. The A/D converters 32-1–32-n converts the output signals of the microphones 1-1–1-n obtained via the low-pass filters 31-1–31-n into digital signals and have a sampling frequency of, for example, 8 kHz. The digital signals have the number of bits which corresponds to the number of bits processed in the DSP 30. For example, the digital signals consists of 8 bits or 16 bits.

An input signal obtained via a network or the like is converted into an analog signal by the D/A converter 33. The analog signal thus obtained passes through the low-pass filter 34, and is then applied to the amplifier 35. An amplified signal drives the speaker 36. The reproduced sound emitted from the speaker 36 serves as noise with respect to the microphones 1-1–1-n. However, as has been described previously, the noise can be suppressed by updating the filter coefficients by the DSP 30.

Figure 12:
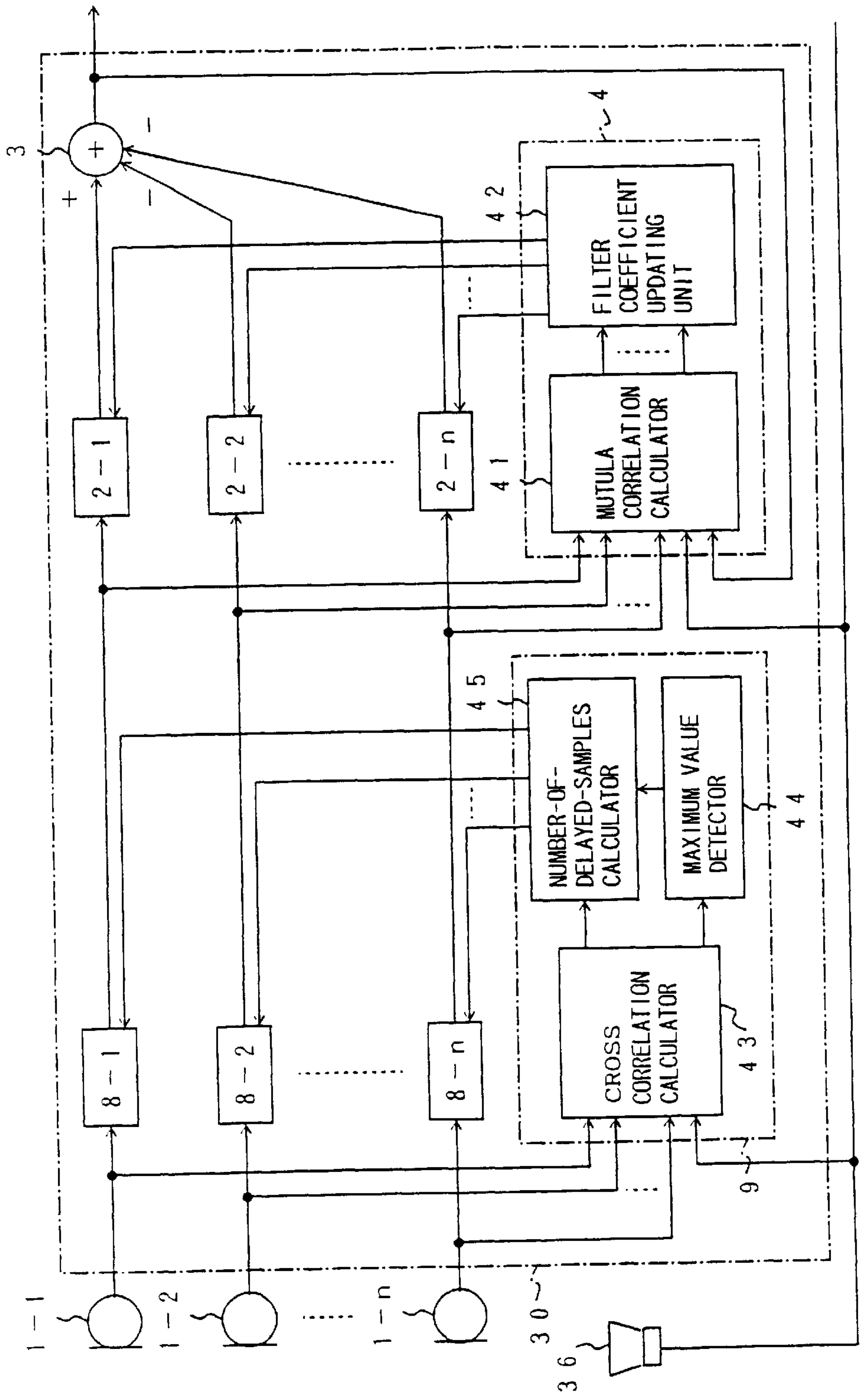
FIG. 12 is a block diagram of an internal structure of the DSP shown in FIG. 11.

FIG. 12 is a block diagram showing functions of the DSP that can be used in the embodiments of the present invention. In FIG. 12, parts that are the same as those shown in the previously described figures are given the same reference numbers. In FIG. 12, the low-pass filters 31-1–31-n and 34, the A/D converters 32-1–32-n, the D/A converter 33 and the amplifier 35 shown in FIG. 11 are omitted. The filer coefficient calculator 4 includes a crosscorrelation calculator 41 and a filter coefficient updating unit 42. The delay calculator 9 includes a crosscorrelation calculator 43, a maximum value detector 44 and a number-of-delayed-samples calculator 45.

The crosscorrelation calculator 43 of the delay calculator 9 receives the output signals gp(j9 of the microphones 1-1–1-n and the drive signal for the speaker 36 (which functions as a noise source), and calculates the crosscorrelation function value Rp(i) defined in formula (13). The maximum value detector 44 detects the maximum value of the crosscorrelation function value Rp(i) in accordance with the flowchart of FIG. 7. The number-of-delayed-samples calculator 45 obtain the numbers dp of delayed samples of the delay units 8-1–8-n by using the ip and imax obtained during the maximum value detecting process. The numbers of delayed samples thus obtained are then set in the delay units 8-1–8-n.

The crosscorrelation calculator 41 of the filter coefficient calculator 4 receives the signals from the noise source delayed so that these signals are in phase by the delay units 8-1–8-n, the drive signal for the speaker 36 serving as a noise source, and the output signal of the adder 3, and calculates the crosscorrelation function value fp(i)' in accordance with equation (16). In the process of calculating the crosscorrelation function value fp(i)', the low-pass filtering process shown in FIG. 10 can be included. The filter coefficient updating unit 42 calculates the filter coefficients cpr in accordance with the equations (17), (18) and (19), and thus the filter coefficients of the filters 2-1–2-n shown in FIG. 5 can be updated.

Figure 13:
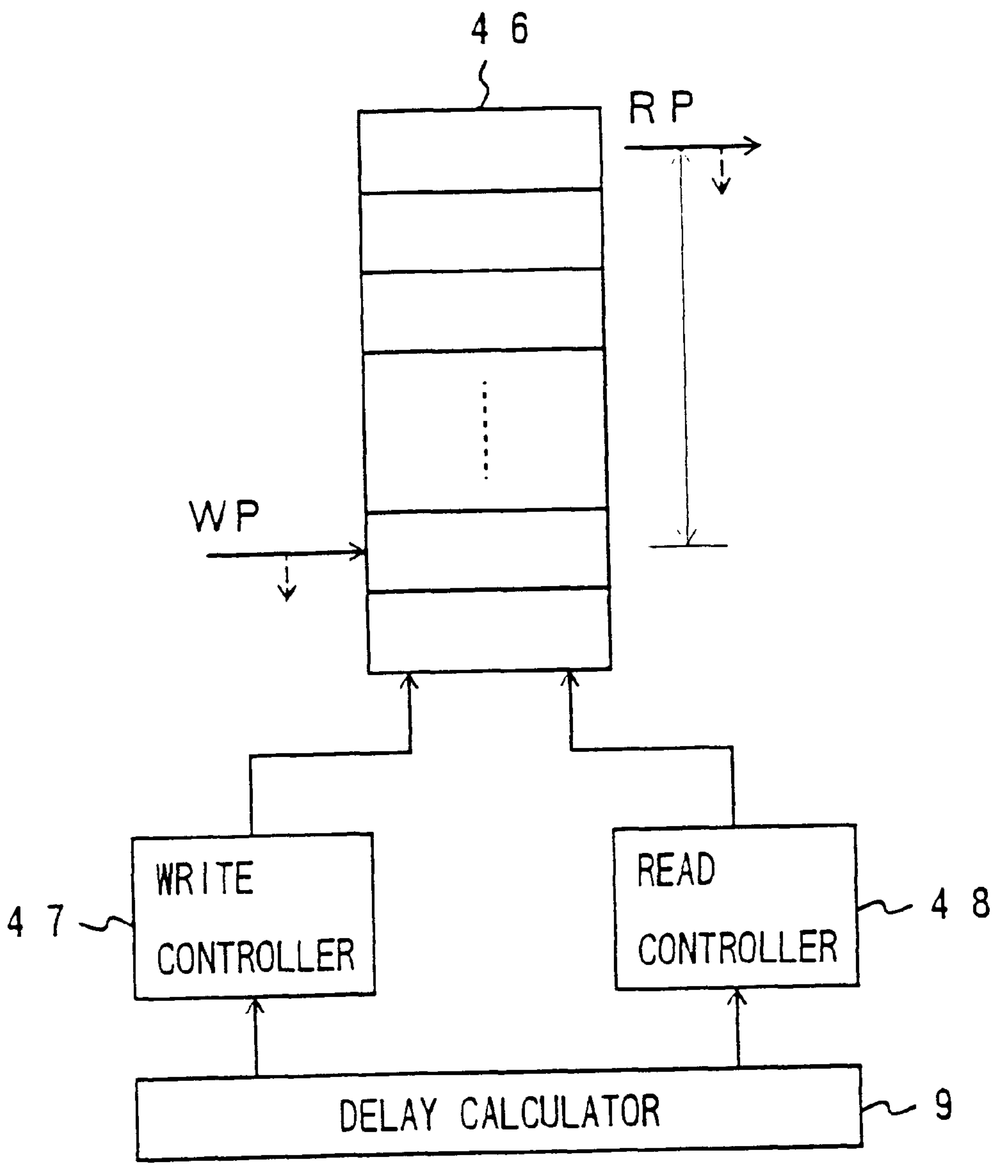
FIG. 13 is a block diagram of a delay unit.

FIG. 13 is a block diagram of a structure of the delay units. Each delay unit includes a memory 46, a write controller 47, and a read controller 49, which controllers are controlled by the delay calculator 9. The delay unit shown in FIG. 13 is implemented by an internal memory built in the DSP. The memory 46 has an area corresponding to the maximum value D of delayed samples. The write operation is performed under the control of the write controller 47, and the read operation is performed under the control of the read controller 48. A write pointer WP and a read pointer RP are set at intervals equal to the number dp of delayed samples calculated by the calculator 9. Further, the write pointer WP and the read pointer RP are shifted in the directions indicated by arrows of broken lines at every write/read timing. Hence, the signal written into the address indicated by the write pointer WP is read when it is indicated by the read pointer RP after the number dp of delayed samples.

Figure 14:
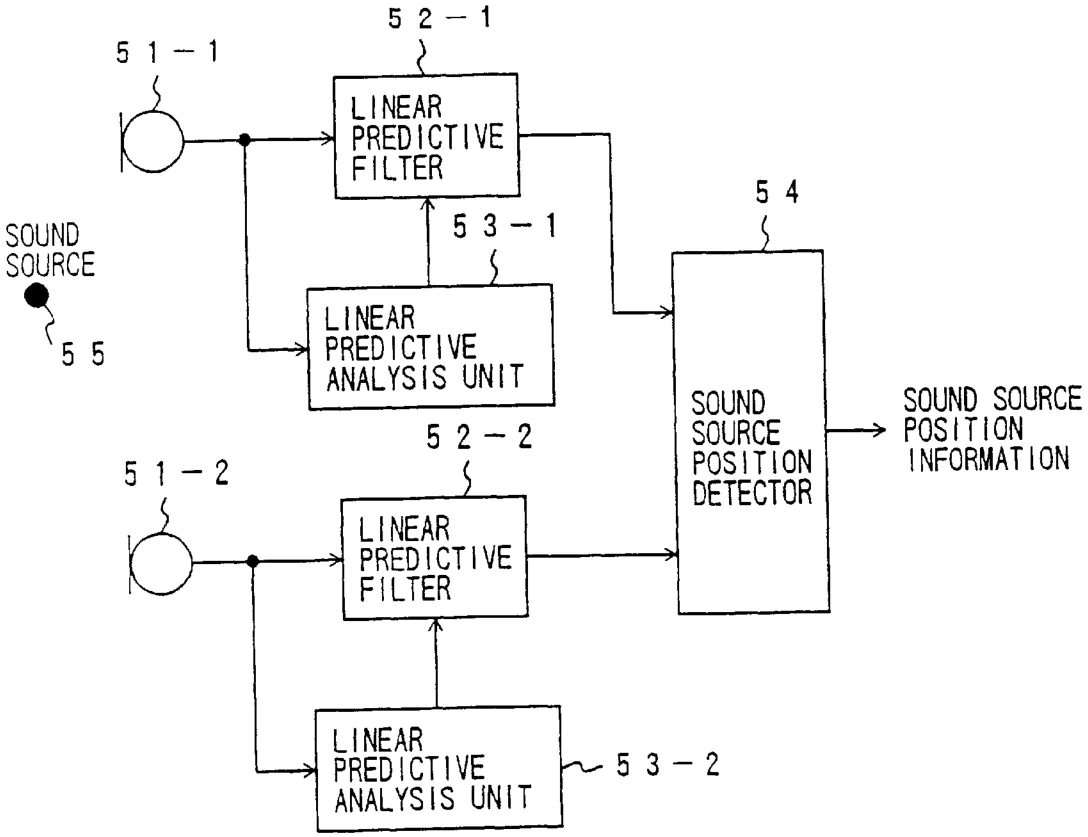
FIG. 14 is a block diagram of a fifth embodiment of the present invention.

FIG. 14 is a block diagram of a fifth embodiment of the present invention, which includes microphones 51-1 and 51-2 forming a microphone array, linear predictive filters 52-1 and 52-2, liner predictive analysis units 53-1 and 53-2, a sound source position detector 54 and a sound source 55 such as a speaker. Although a plurality of microphones more than two can be used to form a microphone array, the structure uses only two microphones 51-1 and 51-2 for the sake of simplicity.

The output signals a(j) and b(j) of the microphones 51-1 and 51-2 are applied to the linear predictive analysis units 53-1 and 53-2 and the linear predictive filters 52-1 and 52-2. Then, the linear predictive analysis units 53-1 and 53-2 obtain autocorrelation function value and thus calculate linear predictive coefficients, which are used to update the filter coefficients of the linear predictive filters 52-1 and 52-2. Then, the position of the sound source 55 is detected by the sound source detector 54 by using a linear predictive residual signal which is the difference between the output signals of the linear predictive filters 52-1 and 52-2. Finally, information concerning the position of the sound source is output.

Figure 15:
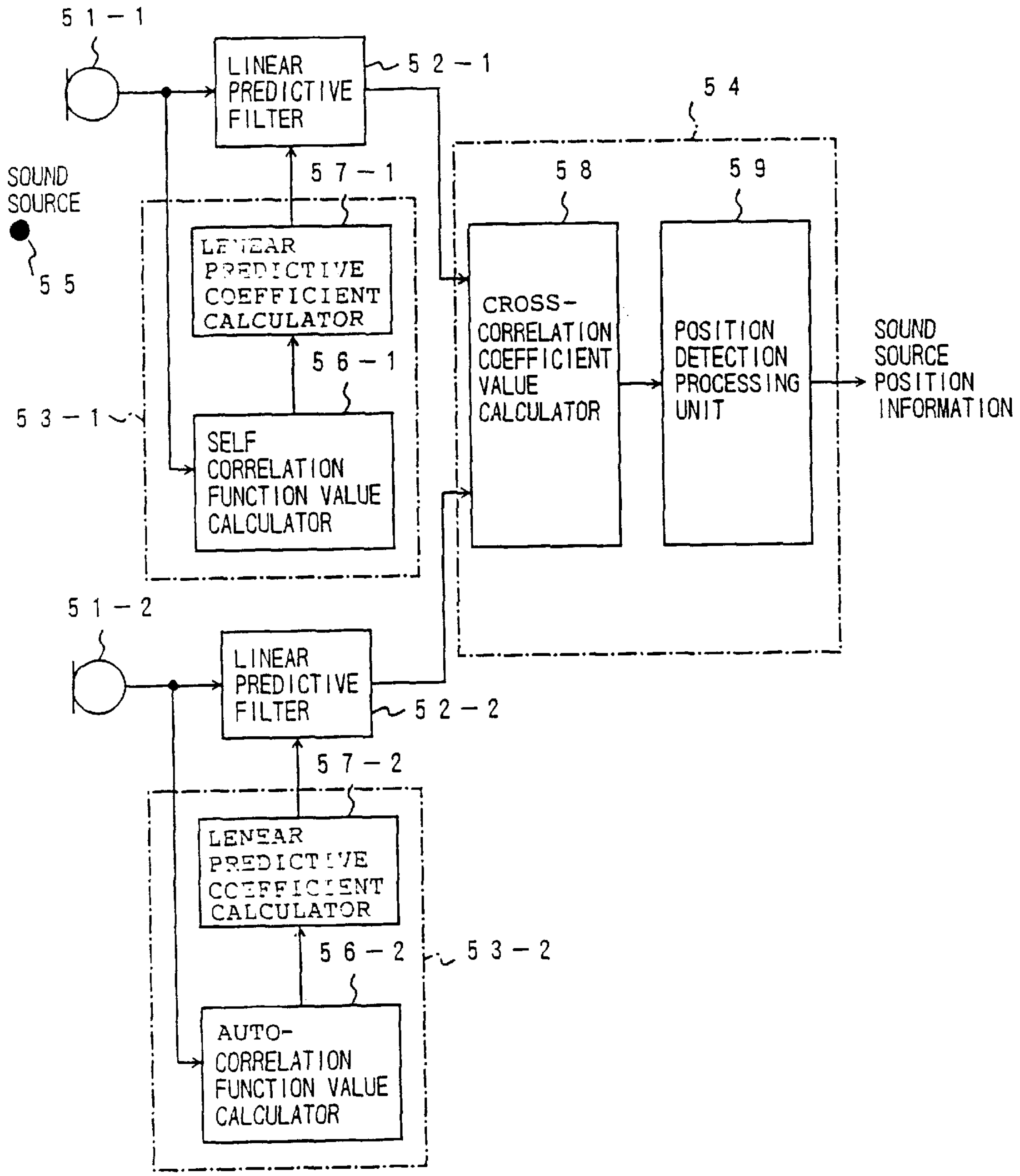
FIG. 15 is a block diagram of a detailed structure of the fifth embodiment of the present invention.

FIG. 15 is a block diagram of the internal structures of the blocks shown in FIG. 14. Referring to FIG. 15, there are illustrated autocorrelation function value calculators 56-1 and 56-2, linear predictive coefficient calculators 57-1 and 57-2, a crosscorrelation coefficient calculator 58, and a position detection processing unit 59. The linear predictive analysis units 53-1 and 53-2 include the autocorrelation function value calculators 56-1 and 56-2, and the linear predictive coefficient calculators 57-1 and 57-2, respectively. The output signals a(j) and b(j) of the microphones 51-1 and 51-2 are respectively input to the autocorrelation function value calculators 56-1 and 56-2.

The autocorrelation function value calculator 56-1 of the linear predictive analysis unit 53-1 calculates the autocorrelation function value Ra(i) by using the output signal a(i) of the microphone 51-1 and the following formula:

$$Ra(i)=\Sigma^{n}_{j=1}a(j)*a(j+i) \quad (23)$$

where $\Sigma^{n}_{j=1}$ denotes a summation of j=1 to j=n, and the symbol n denotes the number of samples on which the convolutional operation is carried out and is generally equal to a few of hundreds. When the symbol q denotes the order of the linear predictive filter, then $0 \leqq i \leqq q$.

The linear predictive coefficient calculator 57-1 calculates the linear predictive coefficients αa1, αa2, . . . , αaq on the basis of the autocorrelation function value Ra(i). The linear predictive coefficients can be obtained any of various known methods such as an autocorrelation method, a partial correlation method and a covariance method. Hence, the linear predictive coefficients can be implemented by the operational functions of the DSP.

In the linear predictive analysis unit 53-2 corresponding to the microphone 51-2, the autocorrelation function value calculator 56-2 calculates the autocorrelation function value Rb(i) by using the output signal b(j) of the microphone 51-2 in the same manner as the formula (23). The linear predictive coefficient calculator 57-2 calculates the linear predictive coefficients αb1, αb2, . . . , αbq.

The linear predictive filters 52-1 and 52-2 may have an qth-order FIR filter. Hence, the filter coefficients c1, c2, . . . , cq are respectively updated by the linear predictive coefficients αa1, αa2, . . . , αaq, αb1, αb2, . . . , αbq. The filter order q of the linear predictive filters 52-1 and 52-2 is defined by the following expression:

$$q=[(\text{sampling frequency})*(\text{intermicrophone distance})]/(\text{speed of sound}) \quad (24)$$

The high-hand side of the formula (24) is the same as that of the aforementioned formula (7).

The source position detector 54 includes the crosscorrelation coefficient calculator 58 and the position detection processing unit 59. The crosscorrelation coefficient calculator 58 calculates the crosscorrelation coefficient r'(i) by using the output signals of the linear predictive filters 52-1 and 52-2, that is, the linear predictive residual signals a'(j) and b'(j) for the output signals a(j) and b(j) of the microphones 51-1 and 51-2. In this case, the variable i meets $-q \leqq i \leqq q$.

Figure 16:
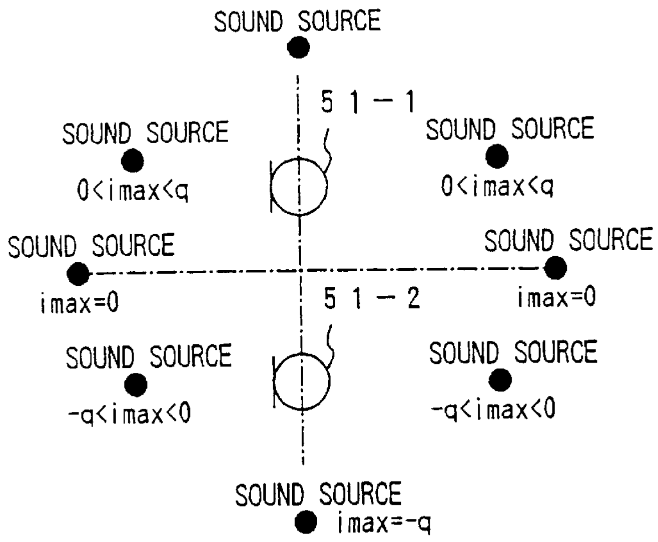
FIG. 16 is a diagram showing a relationship between the sound source position and imax.

The position detection processing unit 59 obtains the value of i at which the crosscorrelation coefficient r'(i) is maximized, and outputs sound source position information indicative of the position of the sound source 55. The relation between the sound source position and the imax is as shown in FIG. 16. When imax=0, the sound source 55 is located in front of or at the back of the microphones 51-1 and 51-2, and is spaced apart from the microphones 51-1 and 51-2 by an even distance. When imax=q, the sound source 55 is located on an imaginary line connecting the microphones 51-1 and 51-2 and is closer to the microphone 51-1. When imax=−q, the sound source 55 is located on an imaginary line connecting the microphones 51-1 and 51-2 and is closer to the microphone 51-2. If three or more microphones are used, it is possible to detect the position of the sound source including information indicating the distances to the sound source.

Generally, the speech signal has a comparatively large autocorrelation function value. The prior art directed to obtaining the crosscorrelation function r(i) using the output signals a(j) and b(j) of the microphones 51-1 and 51-2 cannot easily detect the position of the sound source because the crosscorrelation coefficient r(i) does not change greatly as a function of the variable i. In contrast, according to the embodiments of the present invention, the position of the sound source can be easily detected even for a large autocorrelation function value because the crosscorrelation coefficient r'(i) is obtained by using the linear predictive residual signals.

Figure 17:
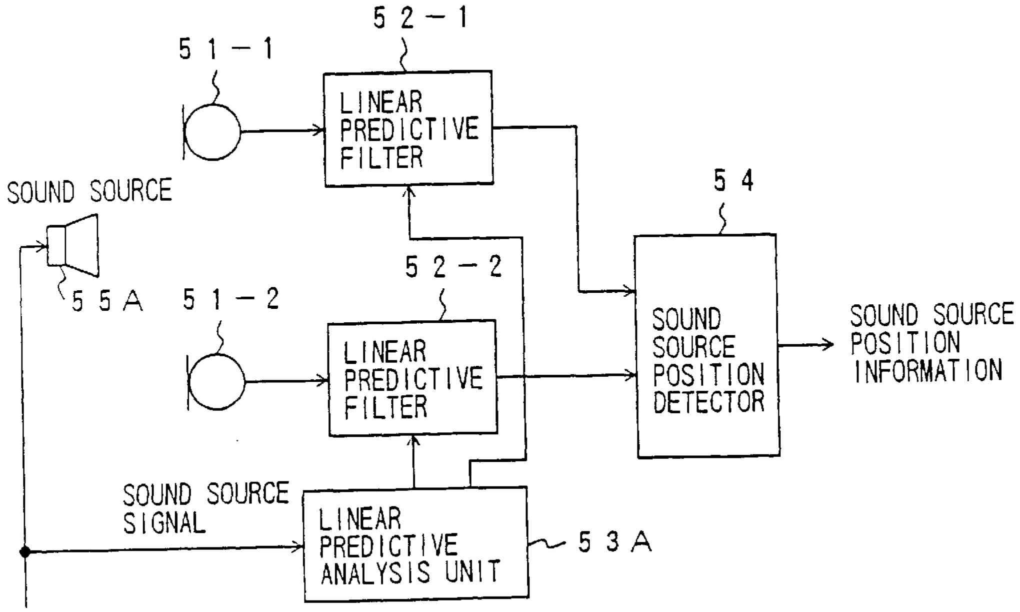
FIG. 17 is a block diagram of a sixth embodiment of the present invention.

FIG. 17 is a block diagram of a sixth embodiment of the present invention, in which parts that are the same as those shown in FIG. 14 are given the same reference numbers. Referring to FIG. 17, there are illustrated a linear predictive analysis unit 53A and a speaker 55A serving as a sound source.1 A drive signal for the speaker 55A is applied to the linear predictive analysis unit 53A, which analyzes the signal of the sound source in the linear predictive manner, and thus obtain the linear predictive coefficients. The linear predictive analysis unit 53 is provided in common to the linear predictive filters 52-1 and 52-2. The linear predictive residual signals for the output signals a(j) and b(j) of the microphones 51-1 and 51-2 are obtained. The sound source position detecting unit 54 obtains the crosscorrelation coefficient r'(i) by using the obtained linear predictive residual signals. Hence, the position of the sound source can be identified.

Figure 18:
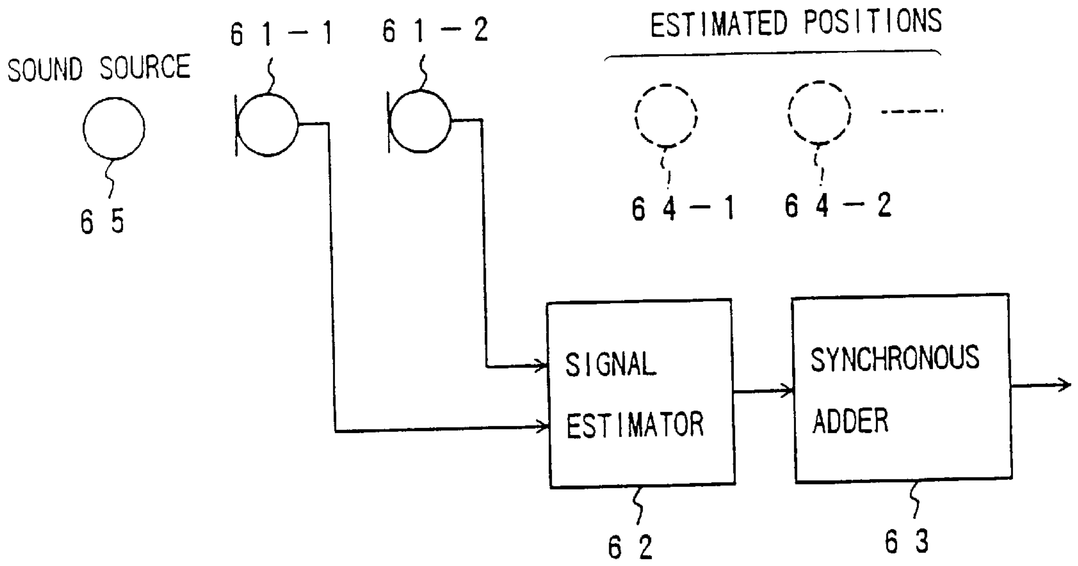
FIG. 18 is a block diagram of a seventh embodiment of the present invention.

FIG. 18 is a block diagram of a seventh embodiment of the present invention. Referring to FIG. 18, there are illustrated microphones 61-1 and 61-2 forming a microphone array, a signal estimator 62, a synchronous adder 63, and a sound source 65. The synchronous adder 63 performs a synchronous addition operation on the output signals of the microphones 61-1 and 61-2 assuming that microphones 64-1, 64-2, . . . are present at estimated positions depicted by the broken lines, these estimated positions being located on an imaginary line connecting the microphones 61-1 and 61-2 together.

Figure 19:
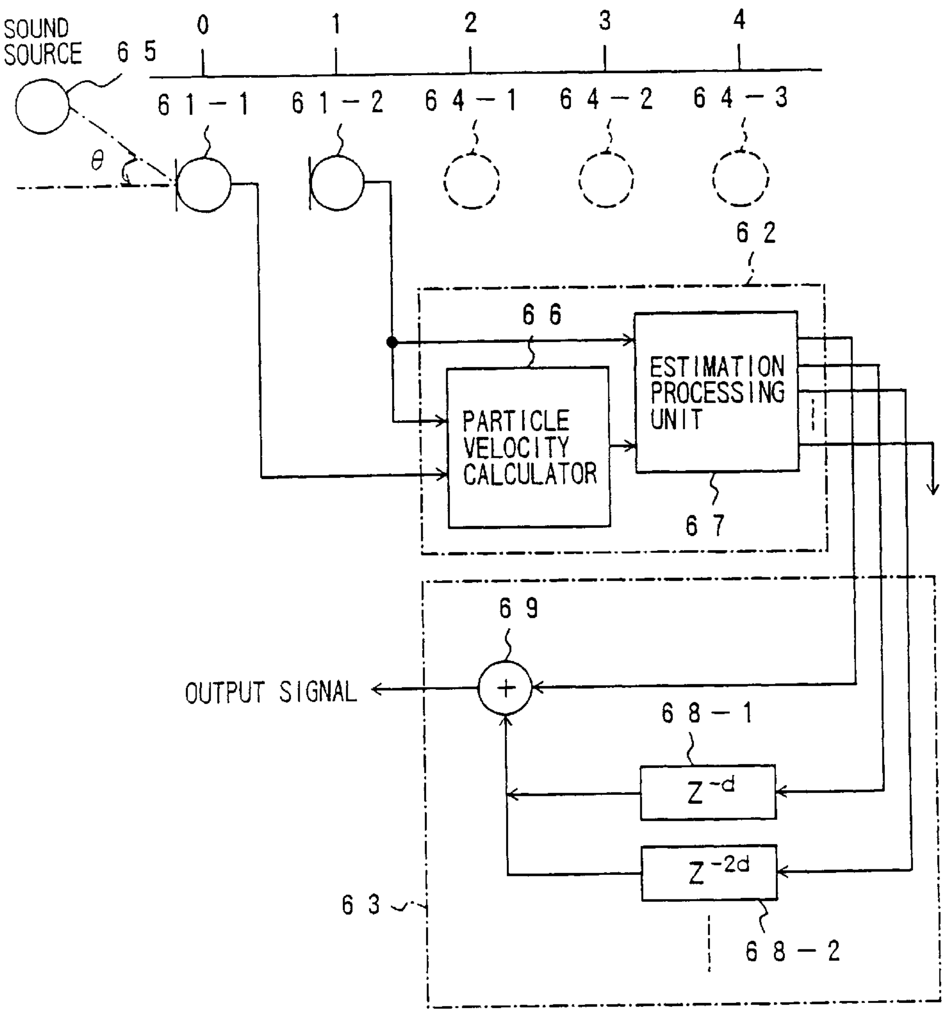
FIG. 19 is a block diagram of a detailed structure of the seventh embodiment of the present invention.

FIG. 19 is a block diagram of the detail of the seventh embodiment of the present invention, in which parts that are the same as those shown in FIG. 18 are given the same reference numbers. There are provided a particle velocity calculator 66, an estimation processing unit 67, delay units 68-1, 68-2, . . . , and an adder 69. FIG. 19 shows a case where the sound source 65 is located at an angle θ with respect to the imaginary line connecting the microphones 61-1 and 61-2 forming the microphone array. The process is carried out under an assumption that the microphones 64-1, 64-2, . . . are arranged on the imaginary line as depicted by the symbols of broken lines.

The signal estimator 62 includes the particle velocity calculator 66 and the estimation processing unit 67. A propagation of the acoustic wave from the sound source 65 can be expressed by the wave equation as follows:

$$-\partial V/\partial x=(1/K)(\partial P)/\partial t)$$

$$-\partial P/\partial t=\sigma(\partial V/\partial t) \quad (25)$$

where P is the sound pressure, V is the particle velocity, K is the bulk modulus, and σ is the density of a medium.

The particle velocity calculator 66 calculates the velocity of particles from the difference between a sound pressure P(j, 0) corresponding to the amplitude of the output signal a(j) of the microphone 61-1 and a sound pressure P(j, 1) corresponding to the amplitude of the output signal b(j) of the microphone 61-2. That is, the velocity V(j+1, 0) of particles at the microphone 61-1 is as follows:

$$V(j+1,0)=V(j,0)+[P(j,1)-P(j,0)] \quad (26)$$

where j is the sample number.

The estimation processing unit 67 obtains estimated positions of the microphones 64-1, 64-2, . . . by the following equations:

$$P(j,x+1)=P(j,x)+\beta(x)[V(j+1,x)-V(j,x)]$$

$$V(J+1,x)=V(j+1,x-1)+[P(j,x-1)-p(j,x)] \quad (27)$$

where x denotes an estimated position and β(x) is an estimation coefficient.

If the positions of the microphones 61-2 and 61-1 are described so that x=1 and x=0, respectively, the microphones 64-1 and 64-2 are respectively located at estimated positions of x=2 and x=3. The estimation processing unit 62 supplies, by using the two microphones 61-1 and 61-2, the synchronous adder 63 with the output signals of the microphones 64-1, 64-2, . . . , as if these microphones 64-1, 64-2, . . . are actually arranged. Hence, even the microphone array formed by only the two microphones 61-1 and 61-2 can emphasize the target sound by the synchronous adding operation as if a large number of microphones is arranged.

The synchronous adder 63 includes the delay units 68-1, 68-2, . . . , and the adder 69. When the number of delayed samples is denoted as d, the delay units 68-1, 68-2, . . . can be described as $z^{-d}$, $Z^{-2d}$, $Z^{-3d}$, The number d of delayed samples is calculated as follows by using the angle θ with respect to the imaginary line connecting the microphones 61-1 and 61-2 together obtained by the aforementioned manner:

$$d=[(\text{number of sampling frequency})^{*}\ (\text{intermichrophone distance})^{*}\cos\theta]/(\text{velocity of sound}) \quad (28)$$

Hence, the output signals of the microphones 61-1 and 61-2 and the output signals of the microphones 64-1, 64-2, . . . located at estimated positions are pulled in phase by the delay units 68-1, 68-2, . . . , and are then added by the adder 69. Hence, the target sound can be emphasized by the synchronous addition operation. With the above arrangement, the target sound can be emphasized so as to have a power obtained by a small number of actual microphones and the estimated microphones.

Figure 20:
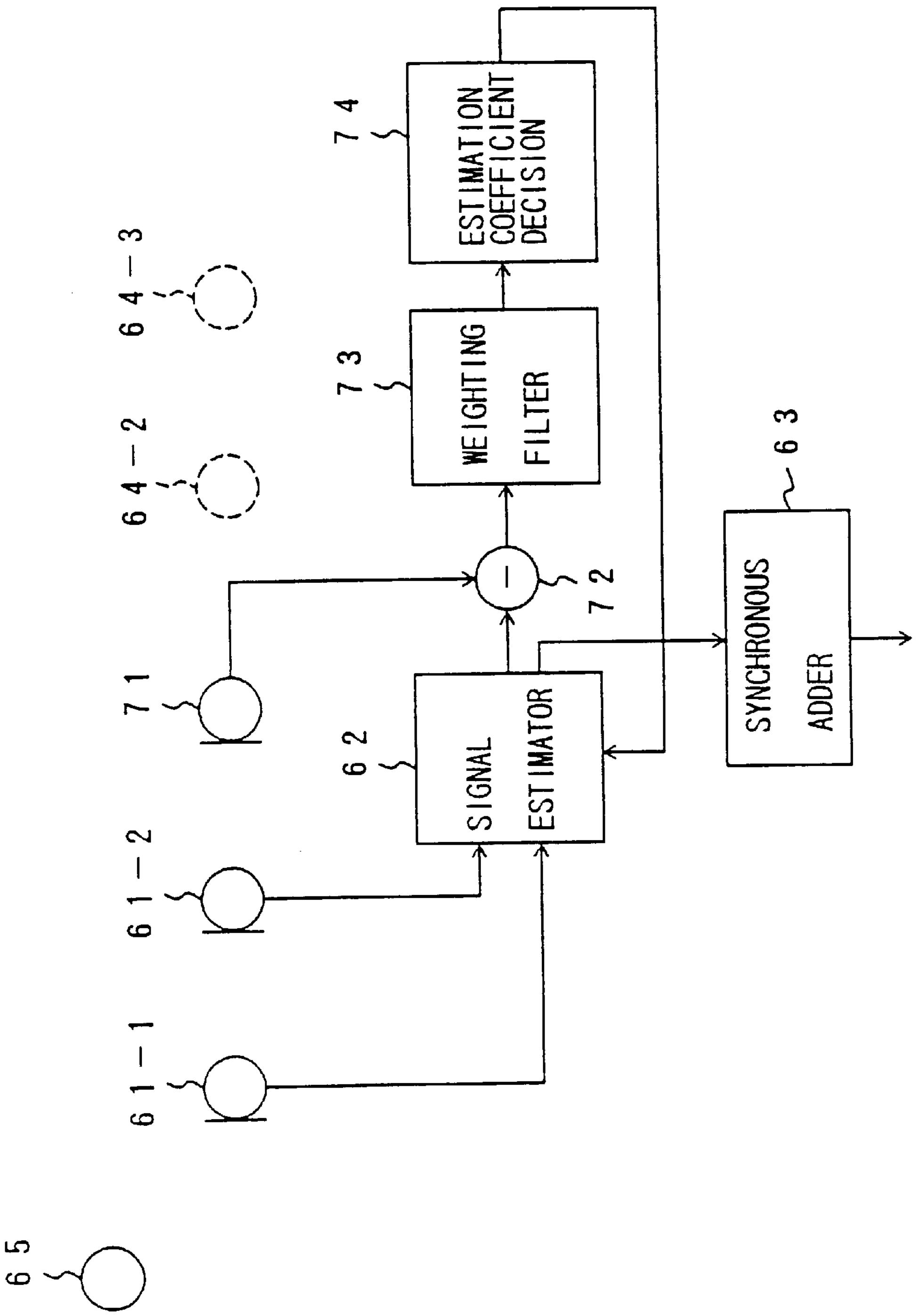
FIG. 20 is a block diagram of an eighth embodiment of the present invention.

FIG. 20 is a block diagram of an eighth embodiment of the present invention in which parts that are the same as those shown in FIG. 18 are given the same reference numbers. Provided are a reference microphone 71, a subtracter 72, a weighting filter 73 and an estimation coefficient decision unit 74. In the eight embodiment of the present invention, the reference microphone 71 is arranged at a position of x=2 so as to have the same intervals as those at which the microphone 61-1 and the microphone 61-2 are located at positions of x=0 and x=1. An estimated position error is obtained by the subtracter 72. The weighting filter 73 processes the estimated position error so as to have an acoustic sense characteristic. Then, the estimation coefficient decision unit 74 determines the estimation coefficient β(x).

More particularly, the subtracter 72 calculates an estimation error e(j) which is the difference between the estimated signal (j, 2) of the microphone 64-1 located at x=2 and the output signal ref(j) of the reference microphone 71 by the following formula:

$$\begin{aligned} e(j) &= P(j, 2) - ref(j) \quad (29) \\ &= P(j, 1) + \beta(2)[V(j+1, 1) - V(j, 1)] - ref(j) \end{aligned}$$

The estimation coefficient decision unit 74 can determine the estimation coefficient β(2) so that the average power of the estimation error e(j) can be minimized. That is, the estimation processing unit 62 (shown in FIG. 18 or FIG. 19) performs an estimation process for the output signals of the estimated microphones 64-1, 64-2, . . . by using the estimation coefficient β(2) with x=2, 3, 4, . . . , and outputs the operation result.

The weighting filter 73 weights the estimation error e(j) in accordance with the acoustic sense characteristic, which is known a loudness characteristic in which sensitivity obtained around 4 kHz is comparatively high. More particularly, a comparatively large weight is given to frequency components of the estimation error e(j) around 4 kHz. Hence, even in the process for the estimated microphones located at x=2, 3, . . . , the estimation error can be reduced in the band having comparatively high sensitivity, and the target sound can be emphasized by the synchronous adding operation.

Figure 21:
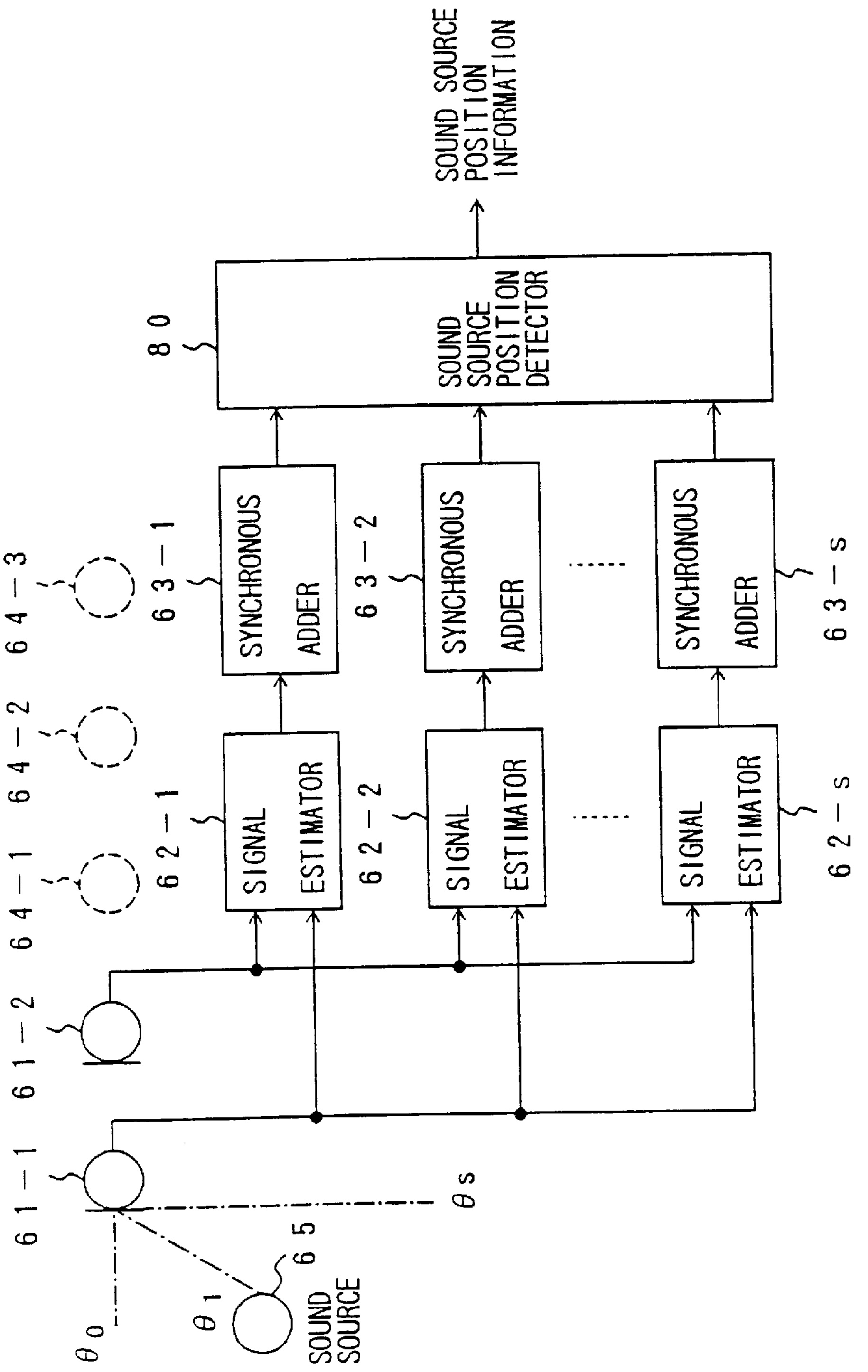
FIG. 21 is a block diagram of a ninth embodiment of the present invention.

FIG. 21 is a block diagram of a ninth embodiment of the present invention. The structure shown in FIG. 21 includes the microphones 61-1 and 61-2 forming a microphone array, signal estimators 62-1, 62-2, . . . , 62-s, synchronous adders 63-1, 63-2, 63-n, estimated microphones 64-1, 64-2, . . . , the sound source 65, and a sound source position detector 80.

The angles $\theta_0$, $\theta_1$, . . . , $\theta_s$ are defined with respect to the microphone array of the microphones 61-1 and 61-2, and the signal estimators 62-1–62-s and the synchronous adders 63-1–63-s are provided to the respective angles. The signal estimators 62-1–62-s obtain estimated coefficients β(x, θ) beforehand. For example, as shown in FIG. 20, the reference microphone 71 is provided to obtain the estimated coefficient β(x, θ).

The synchronous adders 63-1–63-s pull the output signals of the signal estimators 62-1–62-s in phase, and add these signals. Hence, the output signals corresponding to the angles $\theta_{0-\theta s}$ can be obtained. The sound source position detector 80 compares the output signals of the synchronous adders 63-1–63-s with each other, and determines that the angle at which the maximum power can be obtained is the direction in which the sound source 65 is located. Then, the detector 80 outputs information indicating the position of the sound source. Further, the detector 80 can output the signal having the maximum power as the emphasized target signal.

Figure 22:
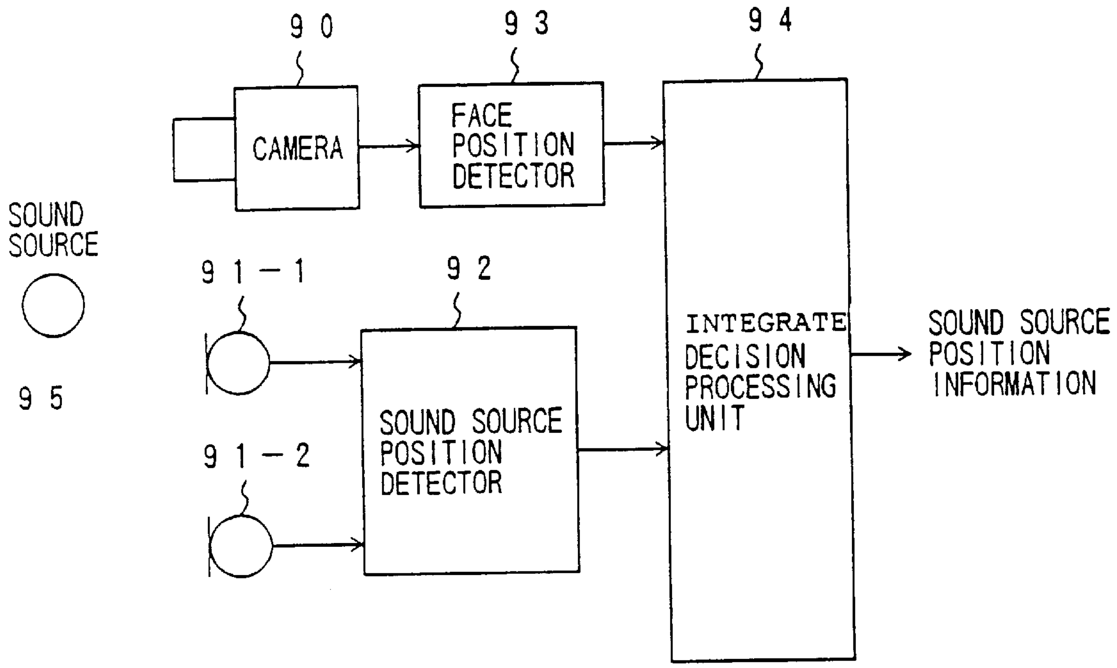
FIG. 22 is a block diagram of a tenth embodiment of the present invention.

FIG. 22 is a block diagram of a tenth embodiment of the present invention, which includes a camera such as a video camera or a digital camera, microphones 91-1 and 91-2 forming a microphone array, a sound source detector 92, a face position detector 93, an integrate decision processing unit 94 and a sound source 95.

The microphones 91-1 and 91-2 and the sound source position detector 92 is any of those used in the aforementioned embodiments of the present invention. The information concerning the position of the sound source 95 is applied to the integrate decision processing unit 94 by the sound source position detector 92. The position of the face of the speaker is detected from an image of the speaker taken by the camera 90. For example, a template matching method using face templates may be used. An alternative method is to extract an area having skin color from a color video signal. The integrate decision processing unit 94 detects the position of the sound source 95 based on the position information from the sound source position detector 92 and the position detection information from the face position detector 93.

For example, a plurality of angles $\theta_{0-\theta s}$ are defined with respect to the imaginary line connecting the microphones 91-1 and 91-2 and the picture taking direction of the camera 90. Then, position information inf-A(θ) indicating the probability of the direction in which the sound source 95 may be located is obtained by a sound source position detecting method for calculating the crosscorrelation coefficient based on the linear predictive errors of the output signals of the microphones 91-1 and 91-2 or by another method using the output signals of the real microphones 91-1 and 91-2 and estimated microphones located on the imaginary line connecting the microphones 91-1 and 91-2 together. Also, position information inf-V(θ) indicating the probability of the direction in which the face of the speaker may be located is obtained. Then, the integrate decision processing unit 94 calculates the product res(θ) of the position information inf-A(θ) and inf-V(θ), and outputs the angle θ at which the product res (θ) is maximized as sound source position information. Hence, it is possible to more precisely detect the direction in which the sound source 95 is located. It is also possible to obtain an enlarged image of the sound source 95 by an automatic control of the camera such as a zoom-in mode.

The present invention is not limited to the specifically disclosed embodiments, and variations and modifications may be made without departing from the scope of the present invention. For example, any of the embodiments of the present invention can be combined for a specific purpose such as noise compression, target sound emphasis or sound source position detection. The target sound emphasis and the sound source position detection may be applied to not only a speaking person but also a source emitting an acoustic wave.

What is claimed is:

1. A microphone array apparatus comprising:

a microphone array including microphones;

a sound source position detector which detects a position of a sound source on the basis of output signals of the microphones;

a camera generating an image of the sound source;

a second detector which detects the position of the sound source on the basis of the image from the camera; and an integrate decision processing unit which outputs information indicating the position of the sound source on the basis of the information from the sound source position detector and the information from the second detector.

* * * * *